United States Patent
Alford et al.

(10) Patent No.: US 8,922,209 B2
(45) Date of Patent: Dec. 30, 2014

(54) SYSTEM AND METHOD FOR MAGNETIC RESONANCE IMAGING

(75) Inventors: Jamu Alford, Ham Lake, MN (US); Blaine Chronik, London (CA); Brian Rutt, London (CA)

(73) Assignee: The University of Western Ontario, London, Ontario (CA)

(*) Notice: Subject to any disclaimer, the term of this patent is extended or adjusted under 35 U.S.C. 154(b) by 860 days.

(21) Appl. No.: 12/921,978

(22) PCT Filed: Mar. 11, 2009

(86) PCT No.: PCT/CA2009/000297
§ 371 (c)(1),
(2), (4) Date: Mar. 21, 2011

(87) PCT Pub. No.: WO2009/111876
PCT Pub. Date: Sep. 17, 2009

(65) Prior Publication Data
US 2011/0160564 A1     Jun. 30, 2011

Related U.S. Application Data

(60) Provisional application No. 61/035,541, filed on Mar. 11, 2008, provisional application No. 61/035,777, filed on Mar. 12, 2008.

(51) Int. Cl.
G01V 3/00     (2006.01)
G01R 33/44    (2006.01)
G01R 33/50    (2006.01)
G01R 33/56    (2006.01)
G01R 33/381   (2006.01)
G01R 33/563   (2006.01)

(52) U.S. Cl.
CPC ............ *G01R 33/56* (2013.01); *G01R 33/5601* (2013.01); *G01R 338/5602* (2013.01); *G01R 33/381* (2013.01); *G01R 33/445* (2013.01); *G01R 33/56341* (2013.01); *G01R 33/50* (2013.01)
USPC .......................................... 324/309; 324/307

(58) Field of Classification Search
USPC .......................... 324/300–322; 600/407–445
See application file for complete search history.

(56) References Cited

U.S. PATENT DOCUMENTS

| | | | |
|---|---|---|---|
| 4,577,152 A | 3/1986 | Macovski | |
| 4,727,326 A * | 2/1988 | Kaplan et al. | 324/309 |
| 6,459,922 B1 * | 10/2002 | Zhang | 600/410 |
| 6,794,869 B2 * | 9/2004 | Brittain | 324/309 |
| 6,801,034 B2 * | 10/2004 | Brittain et al. | 324/309 |
| 6,870,367 B2 * | 3/2005 | Kirsch | 324/309 |
| 6,963,768 B2 * | 11/2005 | Ho et al. | 600/415 |
| 7,403,810 B2 * | 7/2008 | Li et al. | 600/419 |

(Continued)

OTHER PUBLICATIONS

S. Ungersma et al. In Vivo MRI Imaging with T1 Dispersion Contrast, p. 414, 2005.*

(Continued)

*Primary Examiner* — Melissa Koval
(74) *Attorney, Agent, or Firm* — Tarolli, Sundheim, Covell & Tummino LLP

(57) ABSTRACT

A magnetic resonance imaging method comprises performing imaging where more than one polarizing magnetic field strength is used during scanning and processing at least one image resulting from the scanning to yield an enhanced contrast image.

29 Claims, 24 Drawing Sheets

(56) References Cited

U.S. PATENT DOCUMENTS

| | | | |
|---|---|---|---|
| 7,519,412 B2* | 4/2009 | Mistretta | 600/407 |
| 2009/0253983 A1* | 10/2009 | Foo et al. | 600/420 |
| 2013/0021030 A1* | 1/2013 | Zuehlsdorff et al. | 324/309 |

OTHER PUBLICATIONS

WO2004/019996 A1, Ardenk-Jaer-Larsen et al. Mar. 3, 2004.*

S.E. Ungersma, N.L.Matter R.D. Venook, A. Macovski, G.C. Scott, G.E. Gold and S.M. Conolly, "Contrast-Enhanced MRI with Fat Suppression using T1 Dispersion" Proc. Intl. Soc. Mag. Reson. Med. 14 (2006), 1 page (1696).

D.J. Lurie, "Quadrupole-Dips Measured by Whole-Body Field-Cycling Relaxometry and Imaging" University of Aberdeen, Department of Bio-Medical Physics and Bio-Engineering, 1 page.

G.R. Davis and D.J. Lune, "Quantitatve Field-Cycling T1 Dispersion Imaging" Proc. Intl. Soc. Mag. Reson. Med. 13 (2005), 1 page (2187).

J. Alford, W.B. Handler and B.A. Chronik "Development of a Simulation Tool for Field Cycled MRI" Proc. Intl. Soc. Mag. Reson. Med. 13 (2005), 1 page (867).

Alford, Handler & CHRON1K, "Development of a Simulation Tool for Field Cycled MRI" Proc. Intl. Soc. Mag. Reson. Med. 13, 2005, 1 page.

Davies & Lune "Quantitative Field-Cycling T1 Dispersion Imaging" Proc. Intl. Soc. Mag. Reson. Med. 13, 2005, 1 page.

Ungersma, Matter, Venook, Macovski, Scott, Gold & Conolly "Contrast-Enhanced MRI with Fat Suppression usint T1 Dispersion" Proc. Intl. Mag. Reson. Med. 14, 2006, 1 page.

* cited by examiner

Figure 8a
Figure 8b
Figure 8c
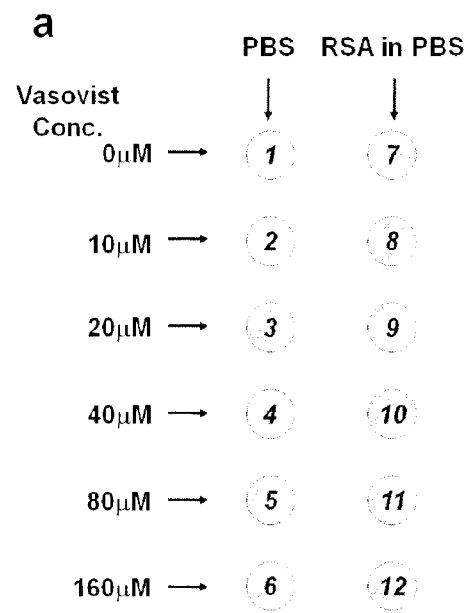
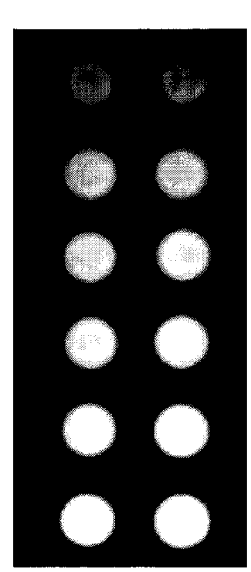
Figure 8d
Figure 8e
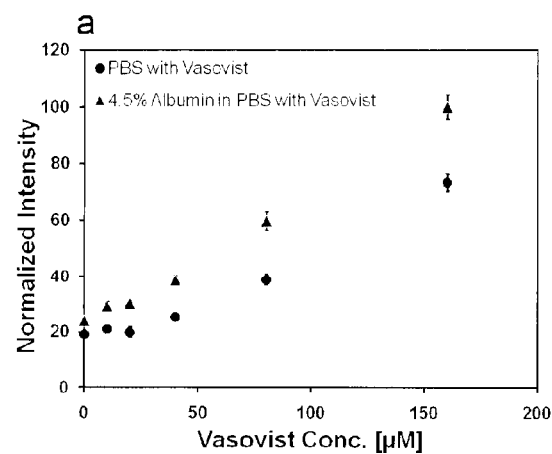
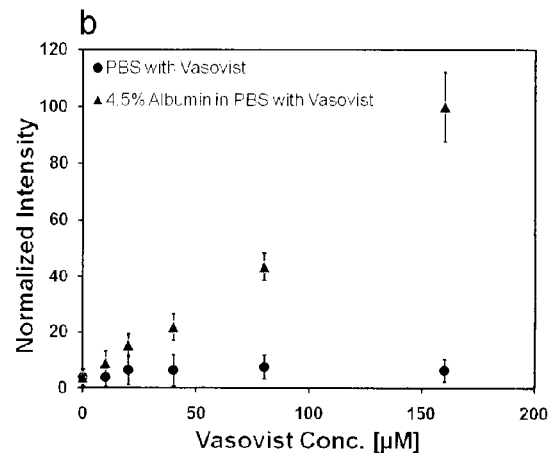

220

SYSTEM AND METHOD FOR MAGNETIC RESONANCE IMAGING

CROSS-REFERENCE TO RELATED APPLICATIONS

This application claims the benefit of U.S. Provisional Application No. 61/035,541 filed on Mar. 11, 2008 for an invention entitled "Magnetic Field-Dependent Image Contrast For Magnetic Resonance Imaging" and the benefit of U.S. Provisional Application No. 61/035,777 filed on Mar. 12, 2008 for an invention entitled "Magnetic Field-Dependent Image Contrast For Magnetic Resonance Imaging", the contents of which are incorporated herein by reference.

FIELD

This specification relates generally to magnetic resonance imaging, and specifically to a system and method for producing image contrasts in magnetic resonance imaging.

BACKGROUND

Nuclear Magnetic Resonance (NMR) imaging, or Magnetic Resonance Imaging (MRI) as it is commonly known, is a non-invasive imaging modality that can produce high resolution, high contrast images of the interior of a subject. MRI involves the interrogation of the nuclear magnetic moments of a sample placed in a strong magnetic field with radio frequency (RF) magnetic fields. During MRI the subject, typically a human patient, is placed into the bore of an MRI machine and is subjected to a uniform static polarizing magnetic field $B_0$ produced by a polarizing magnet housed within the MRI machine. Radio frequency (RF) pulses, generated by RF coils housed within the MRI machine in accordance with a particular localization method, are typically used to scan target tissue of the patient. MRI signals are radiated by excited nuclei in the target tissue in the intervals between consecutive RF pulses and are sensed by the RF coils. During MRI signal sensing, gradient magnetic fields are switched rapidly to alter the uniform magnetic field at localized areas thereby allowing spatial localization of MRI signals radiated by selected slices of the target tissue. The sensed MRI signals are in turn digitized and processed to reconstruct images of the target tissue slices using one of many known techniques.

When a substance, such as human tissue is subjected to the static polarizing magnetic field $B_0$, the individual magnetic moments of the spins in the tissue attempt to align with the static polarizing magnetic field $B_0$, but precess about the static polarizing magnetic field $B_0$ in random order at their characteristic Larmor frequency. The net magnetization vector lies along the direction of the static polarizing magnetic field $B_0$ and is referred to as the equilibrium magnetization $M_0$. In this configuration, the Z component of the magnetization or longitudinal magnetization $M_Z$ is equal to the equilibrium magnetization $M_0$. If the target tissue is subjected to an excitation magnetic field $B_1$, which is in the x-y plane and which is near the Larmor frequency, the longitudinal magnetization $M_Z$ may be rotated, or "tipped" into the x-y plane to produce a net transverse magnetic moment $M_{XY}$. When the excitation magnetic field $B_1$ is terminated, relaxation of the excited spins occurs, with a signal being emitted that effects the magnitude of radiated MRI signals. The emitted signal is received and processed to form an image.

In particular, when the excitation magnetic field $B_1$ is terminated, the longitudinal magnetization $M_Z$ relaxes back to its equilibrium. The time constant that describes how the longitudinal magnetization $M_Z$ returns to its equilibrium value is commonly referred to as the spin lattice relaxation time $T_1$. The spin lattice relaxation time $T_1$ characterizes the time required to reduce the difference between the longitudinal magnetization $M_Z$ and its equilibrium value $M_0$ to zero.

The net transverse magnetic moment $M_{XY}$ also relaxes back to its equilibrium when the excitation magnetic field $B_1$ is terminated. The time constant that describes how the transverse magnetic moment $M_{XY}$ returns to its equilibrium value is commonly referred to as the transverse relaxation time or spin-spin relaxation time $T_2$. The transverse relaxation time $T_2$ characterizes the time required to reduce the transverse magnetic moment $M_{XY}$ to zero. Both the spin lattice relaxation time $T_1$ and the transverse relaxation time $T_2$ are tissue specific and vary with concentration of different chemical substances in the tissue as well as with different microstructural features of the tissue. Variations of the spin lattice relaxation time $T_1$ and/or the transverse relaxation time $T_2$ from normal can also be indicative of disease or injury.

Like many diagnostic imaging modalities, MRI can be used to differentiate tissue types, e.g. muscles from tendons, white matter from gray matter, healthy tissue from pathologic tissue. There exist many different MRI techniques, the utility of each depending on the particular tissue under examination. Some techniques examine the rate of tissue magnetization, while other techniques measure the amount of bound water or the velocity of blood flow. Often, several MRI techniques are used together to improve tissue identification. In general, the greater the number of tests available the better chance of producing a correct diagnosis.

In some instances contrast agents may be used to emphasize certain anatomical regions. For example, a Gadolinium chelate injected into a blood vessel will produce enhancement of the vascular system, or the presence and distribution of leaky blood vessels. Iron-loaded stem cells injected into the body and detected by MRI, will allow stem cell migration and implantation in-vivo to be tracked. For a contrast agent to be effective the contrast agent must preferentially enhance one tissue type or organ over another.

Clinical MRI machines commonly utilize superconducting windings to produce a strong, static polarizing magnetic field $B_0$ that remains at a fixed magnetic field strength. Because the magnetic field strength is fixed, these clinical MRI machines are unsuitable for use in tests that measure the dependence of parameters on the strength of the applied magnetic field. There are characteristics of certain tissues, materials or contrast agents that would be better identified or quantified if it were possible to measure the variation of the MRI properties of those tissues, materials or contrast agents over a range of polarizing magnetic field strengths, not just at a single polarizing magnetic field strength.

Accordingly, there is a continuing need for improvements in MRI. It is therefore an object to provide a novel system and method for producing image contrasts in magnetic resonance imaging.

SUMMARY

Accordingly, in one aspect there is provided a magnetic resonance imaging method comprising performing imaging where more than one polarizing magnetic field strength is used during scanning; and processing at least one image resulting from said scanning to yield an enhanced contrast image.

In one embodiment, the performing comprises shifting the strength of the polarizing magnetic field of an MRI machine in more than one direction during a relaxation portion of a pulse sequence and thereafter acquiring an image. The timing, magnitude and duration of each polarizing magnetic field shift is chosen to maximize the desired image contrast enhancement. The polarizing magnetic field is also shifted in each direction by substantially the same amount. The shifting in one form comprises conditioning an electromagnet that is removeably inserted in the MRI machine to generate magnetic field pulses of opposite polarities to shift the polarizing magnetic field in opposite directions. The electromagnet may be axially positioned within a bore of the MRI machine or may be placed in the bore of the MRI machine either beneath or beside a patient.

According to another aspect there is provided a magnetic resonance imaging method comprising performing multiple scans of a subject and generating an image for each scan, each scan being conducted utilizing a different polarizing magnetic field; and processing the images to yield an enhanced contrast image.

In one embodiment, the performing comprises shifting the polarizing magnetic field of an MRI machine in one direction during a relaxation portion of a first pulse sequence and thereafter acquiring an image and shifting the polarizing magnetic field of the MRI machine in an opposite direction during a relaxation portion of a second pulse sequence and thereafter acquiring an image. The first shifting comprises subjecting the polarizing magnetic field of the MRI machine to a magnetic field pulse of a first polarity during the relaxation portion of the first pulse sequence and the second shifting comprises subjecting the polarizing magnetic field of the MRI machine to a magnetic field pulse of a second polarity during the relaxation portion of the second pulse sequence.

According to yet another aspect there is provided a method for magnetic resonance imaging comprising subjecting a sample to polarizing magnetic fields of different strengths and acquiring a scan associated with each polarizing magnetic field; and processing the scans to generate selective image contrast of said sample based on the variation of at least one MR property of the sample in response to the different polarizing magnetic field strengths.

According to still yet another aspect there is provided an auxiliary magnetic field generator for an MRI machine comprising an electromagnet device for insertion into said MRI machine, said electromagnet device being controllable to shift the strength of the polarizing magnetic field of said MRI machine in opposite directions during relaxation portions of an MRI pulse sequence.

In one embodiment, the auxiliary magnetic field further comprises a shield to reduce external magnetic flux emitted by the auxiliary magnetic field generator. The electromagnet device in one form comprises a primary electromagnet and wherein the shield comprises a coil coaxial with and surrounding the primary electromagnet. In another form, the electromagnet comprises a series of independent coils that are configured to balance torque. Cooling structure can also be included to cool the electromagnet device.

According to still yet another aspect there is provided an MRI machine comprising a housing having a bore in which a subject to be imaged is placed; a polarizing electromagnet accommodated by said housing and generating a generally uniform polarizing magnetic field within said bore; pulse generating coils to generate pulses in a sequence to scan the subject; gradient coils to encode acquired MRI signals; and an auxiliary magnetic field generator of the type described above controllable to shift the strength of the polarizing magnetic field in opposite directions during relaxation portions of the sequence.

BRIEF DESCRIPTION OF THE DRAWINGS

Embodiments will now be described, by way of example only, with reference to the accompanying drawings, in which:

FIG. 7b shows delta relaxation enhanced MR contrast for the same tissues and contrast agent concentration as FIG. 7a;

FIG. 8a shows an experimental sample;

FIG. 8b shows a conventional $T_1$-weighted image of the sample;

FIG. 8c shows a $T_1$-weighted image of the sample acquired using the subject system and method;

FIGS. 8d and 8e are graphs of sample intensities found in the images shown in FIGS. 8b and 8c;

DESCRIPTION OF EMBODIMENTS

Embodiments described in the present specification relate to a method and system for magnetic resonance imaging of samples which makes use of a dynamically controlled MRI polarizing magnetic field and a contrast agent or endogenous substance that demonstrates a magnetic field-dependent variation in one or more MRI properties. In general, a variable magnetic field is used to highlight this MRI property variation, and an image that is sensitive to the MRI property variation, and not to the average value of the MRI property variation is generated. In one particular embodiment, the method and system take advantage of the change in longitudinal relaxivity vs. magnetic field strength, i.e. the relaxivity slope, to generate selective image contrast occurring when a contrast agent binds to a given target molecule. In other embodiments, variations other than the slope may be examined. A removable auxiliary magnetic field generator, which is attached to a conventional MRI machine is employed to allow the MRI machine to effectively generate two or more discrete polarizing magnetic fields of different strengths during an MRI pulse sequence.

Figure 1:
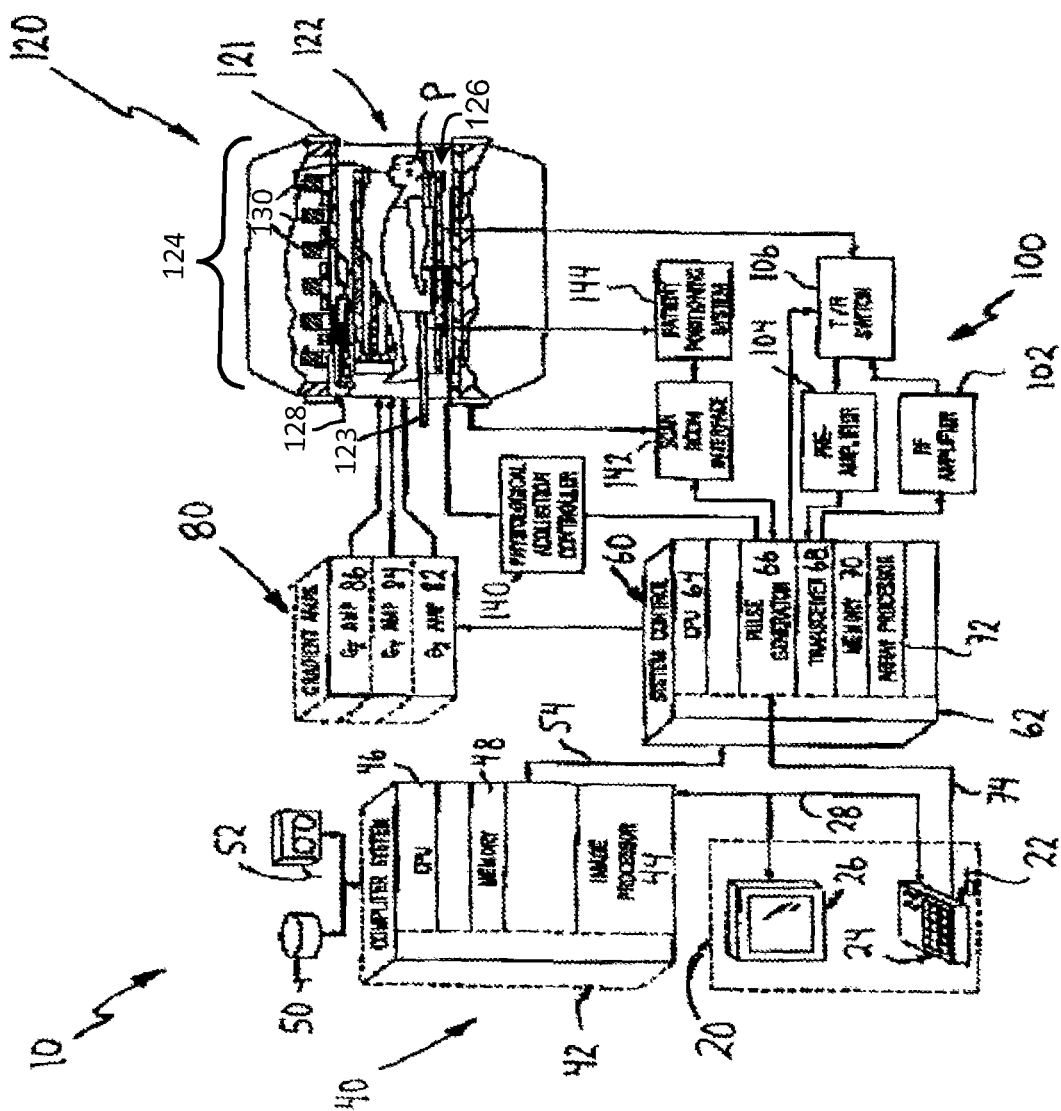
FIG. 1 is a schematic block diagram of an MRI system.

Turning now to FIG. 1, a bore-type MRI system is shown and is generally identified by reference numeral 10. The MRI system 10 includes an operator console 20, a computer system 40, a system controller 60, a gradient amplifier system 80, an RF coil control circuit 100 and an MRI machine 120. The operator console 20 allows an operator to control the MRI system 10 including the production and display of images. The computer system 40 is responsive to commands generated by the operator console 120 and generates images for display. The system controller 60 communicates with the operator console 20, the computer system 40, the gradient amplifier system 80 and the RF coil control circuit 100 and orchestrates the acquisition of images in response to commands generated by the operator console 20. The MRI machine 120 communicates with the gradient amplifier system 80 and the RF coil control circuit 100.

The operator console 20 includes an input device 22, a control panel 24 coupled to the input device 22, and a display 26. The input device 22 can include a mouse, joystick, keyboard, trackball, touch screen, light wand, voice control, or similar such device, and may be used for interactive geometry prescription. The operator console 20 communicates with the computer system 40 over a data communications link 28 thereby to enable an operator to control the production and presentation of images on the display 26.

The computer system 40 includes a number of modules, which communicate with each other through a backplane 42. As can be seen, the modules of computer system 40 include an image processor module 44, a CPU module 46, and a memory buffer 48, known in the art as a frame buffer for storing image data arrays. The computer system 40 is linked to a disk storage 50 and a tape drive 52 for storage of image data and programs. The computer system 40 communicates with the system controller 60 over a high-speed serial data communications link 54.

The system controller 60 also includes a number of modules, which communicate with each other through a backplane 62. The modules of system controller 60 include a CP module 64, a pulse generator module 66, a transceiver module 68, a memory module 70 and an array processor module 72. The pulse generator module 66 communicates with the operator console 20 over a serial data communications link 74.

The gradient amplifier system 80 includes Gx, Gy and Gz gradient amplifiers 82 to 86 respectively. The gradient amplifiers 82 to 86 receive input gradient pulse data from the system controller 60 and generate output gradient pulses that are conveyed to the MRI machine 120.

The RF coil control circuit 100 includes an output RF amplifier 102, an input RF preamplifier 104 and a transmit/receive (T/R) switch 106. The output RF amplifier 102 and input RF preamplifier 104 communicate with the transceiver module 68 of the system controller 60. The T/R switch 106 is coupled to the MRI machine 120 and to the RF amplifier 102 and RF preamplifier 104.

The MRI machine 120 includes a cryostat 121 having bore 122 to receive a patient P supported on table 123. A magnet assembly 124 and RF coils 126 are disposed within the MRI machine 120. The magnet assembly 124 includes a polarizing electromagnet 128 to generate a uniform static polarizing magnetic field $B_0$ and gradient coils 130 that are responsive to the output gradient signals generated by the gradient amplifiers 82 to 86. Each gradient coil 130 is associated with a respective one of the gradient amplifiers. The RF coils 126 are coupled to the T/R switch 106.

In addition to the above components, the MRI system 10 includes a physiological acquisition controller 140, a scan room interface circuit 142 and a patient positioning system 144. The physiological acquisition controller 140 is coupled to the pulse generator module 66 and to the MRI machine 120. The scan room interface circuit 142 is coupled to the pulse generator module 66, the patient positioning system 144 and the MRI machine 120. The patient positioning system 144 is also coupled to the MRI machine 120. The physiological acquisition controller 140 receives signals from a number of different sensors connected to the patient P, such as ECG signals from electrodes attached to the patient, and conveys the signals to the pulse generator module 66. The scan room interface circuit 142 receives input from various sensors associated with the condition of the patient and the magnet assembly 124 and conveys the signals to the pulse generator module 66. The patient positioning system 144 receives commands from the scan room interface circuit 142 and in response moves the patient P within the MRI machine 120 to the desired location for the scan.

The general operation of the MRI system 10 will firstly be described for ease of understanding. During imaging, the patient P within the MRI machine 120 is subjected to a uniform static polarizing magnetic field $B_0$ produced by the polarizing electromagnet 128. RF pulses are then generated by the RF coils 126 in a particular sequence and are used to scan target tissue of the patient. MRI signals radiated by excited nuclei in the target tissue in the intervals between consecutive RF pulses are sensed by the RF coils 126. During this MRI signal sensing, the polarizing magnetic field is altered by the gradient coils 130 in response to received output gradient data thereby to position encode acquired MRI signals.

The sequence of RF pulses used to scan the patient P is generated by the RF coils 126 in response to pulse sequence data received from the pulse generator module 66 of the system controller 60 via the transceiver module 68 and RF coil control circuit 100. The pulse sequence data determines the timing, strength and shape of the RF pulses in the pulse sequence as well as the MRI signal acquisition window. The RF sequence data is generated by the pulse generator module 66 in response to scan commands received from the operator console 20 via the data communications link 74.

When an RF pulse is to be applied to the target tissue, the RF coil control circuit 100 is conditioned to a transmit mode by the pulse generator module 66. In the transmit mode, the T/R switch 106 couples the output RF amplifier 102 to the RF coils 126. RF pulse data generated by the pulse generator module 66 is converted into an RF pulse via the transceiver module 68 and RF amplifier 102 and applied to the RF coils 126.

The pulse generator module 66 also generates gradient data in response to the scan commands received from the operator console 20 via the data communications line 74 and conveys the gradient data to the gradient amplifier system 80. The gradient data determines the timing and shape of the output gradient pulses generated by the gradient amplifiers 82 to 86 that are applied to the gradient coils 130 during scanning.

During MRI signal sensing in the MRI signal acquisition window, the pulse generator module 66 conditions the RF coil control circuit 100 to a receive mode. In the receive mode, the T/R switch 106 couples the input RF preamplifier 104 to the RF coils 126.

The MRI signals radiated by excited nuclei in the target tissue are sensed by the RF coils 126 and conveyed to the transceiver module 68 via the T/R switch 106 and input RF preamplifier 104. The amplified MRI signals are in turn demodulated, filtered and digitized by the transceiver module 68 and then transferred to the memory module 70.

After a scan of the target tissue is completed, an array of raw k-space data is stored in the memory module 70. The array processor 72 Fourier transforms the raw k-space data into an array of image data that is conveyed through the serial data communication link 54 to the computer system 20 where it is stored in the disk memory 50. In response to commands received from the operator console 20, the image data may be archived on the tape drive 52, or it may be further processed by the image processor 44 and conveyed to the operator console 20 for presentation on the display 26.

Figure 2:
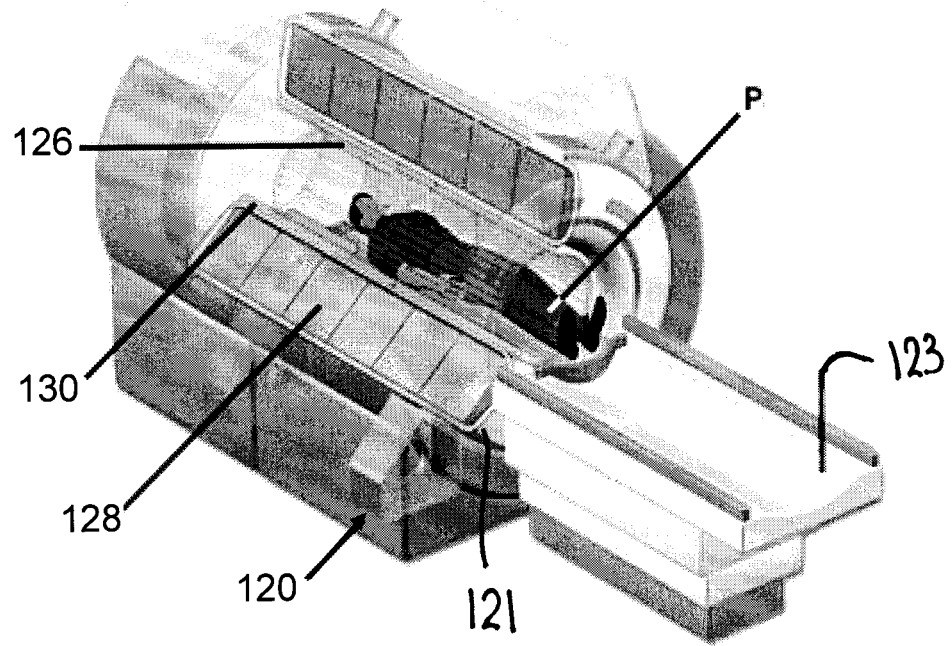
FIG. 2 is a cutaway view of an MRI machine forming part of the MRI system of FIG. 1.

FIG. 2 is a cutaway view of the MRI machine 120 and illustrates the spatial positioning of the polarizing electromagnet 128, RF coils 126, and gradient coils 130 within the MRI machine 120.

As mentioned previously, the polarizing electromagnets of conventional clinical MRI machines, which commonly utilize superconducting windings, produce strong polarizing magnetic fields that remain at a fixed magnetic field strength. Because the magnetic field strength is fixed, these clinical MRI machines are unsuitable for use in tests that measure the dependence of parameters on the strength of the applied magnetic field. To address this issue, as stated above, an auxillary magnetic field generator is attached to the MRI machine 120 to allow the MRI machine to generate two or more discrete polarizing magnetic fields of different strengths during an MRI pulse sequence. As a result, this allows the MRI machine 120 to be used in tests that measure the dependence of parameters on the strength of the applied magnetic field.

Delta relaxation enhanced magnetic resonance is a magnetic resonance (MR) method suitable for producing image contrasts related to the magnetic field dependence of tissue relaxation rates. Applications include cellular/molecular MRI, where delta relaxation enhanced MR may significantly increase the detection sensitivity/specificity to in-vivo target molecules. Realization of the delta relaxation enhanced MR concept requires the use of an MRI machine having a polarizing electromagnet that is capable of generating a variable strength polarizing magnetic field (see Reference 1) as well as a contrast agent that exhibits magnetic field-dependent MR relaxation properties, such as an activatable contrast agent that demonstrates relaxivity slope changes upon recognition of the target molecule.

In MRI, specific tissue contrasts are produced through particular pulse sequences. Contrast agents may be used when a desired tissue contrast cannot be obtained through pulse sequence alone. Contrast-enhanced MRI can be generally categorized as either positive or negative contrast. In negative contrast, image intensity decreases at sites of MR contrast agent accumulation as a result of the dominating effect of a decreased transverse relaxation time $T_2$. For example, stem cells are tracked in vivo by introduction of negative contrast, superparamagnetic or ferromagnetic agents that shorten the transverse relaxation time $T_2$ in the surrounding water molecules. In positive contrast, image intensity increases at sites of MR contrast agent accumulation as a result of the dominating effect of a decreased longitudinal relaxation time $T_1$. For example, in magnetic resonance angiography (MRA), positive contrast agents are used to improve blood-tissue contrast by increasing the longitudinal relaxation rate ($R_1=1/T_1$) of any water molecules that diffuse into close proximity of their paramagnetic center.

The "strength" of a paramagnetic, positive or $T_1$ contrast agent can be described by its longitudinal relaxivity, $r_1$; defined as the enhanced relaxation rate per unit concentration of the contrast agent. The longitudinal relaxivity of a contrast agent indicates its efficiency at increasing the longitudinal relaxation rate ($R_1=1/T_1$) of surrounding tissues and thereby the greater its ability to enhance contrast in $T_1$-weighted MR images. Equation 1 below gives the longitudinal relaxation rate $R_1$ of a tissue, which has taken up a paramagnetic contrast agent of concentration [CA] and relaxivity $r_1$:

$$R_1 = R_1^0 + r_1 * [CA] \qquad \text{Equation 1}$$

where $R_1^0$ is used to signify the relaxation rate of unenhanced tissue at a particular polarizing magnetic field strength $B_0$.

The relaxation rate $R_1$ of tissues as well as the relaxivities of contrast agents are not constant and depend directly on the magnitude of the encompassing polarizing magnetic field.

The rate of molecule tumbling of a contrast agent during free diffusion in blood and tissue is a factor in determining the relaxivity of the contrast agent. Rapidly tumbling molecules exhibits lower relaxivities (typically <10 $s^{-1}$ $mM^{-1}$) that decline gradually with increasing magnetic field strengths above 0.5 T. Some existing gadolinium chelates demonstrate non-specific weak protein binding, a feature that slows their free tumbling. Newer "sensing" contrast agents are designed to more specifically and more strongly bind to certain proteins or classes of proteins or other macromolecular or cellular entities (see Reference 2). Upon binding, the resulting decreased tumbling rate has been shown to produce a dramatic increase in relaxivity at low magnetic field strengths (e.g. less than about 0.5 T) with little enhanced relaxivity at higher magnetic field strengths (e.g. above 3 T).

Figure 3:
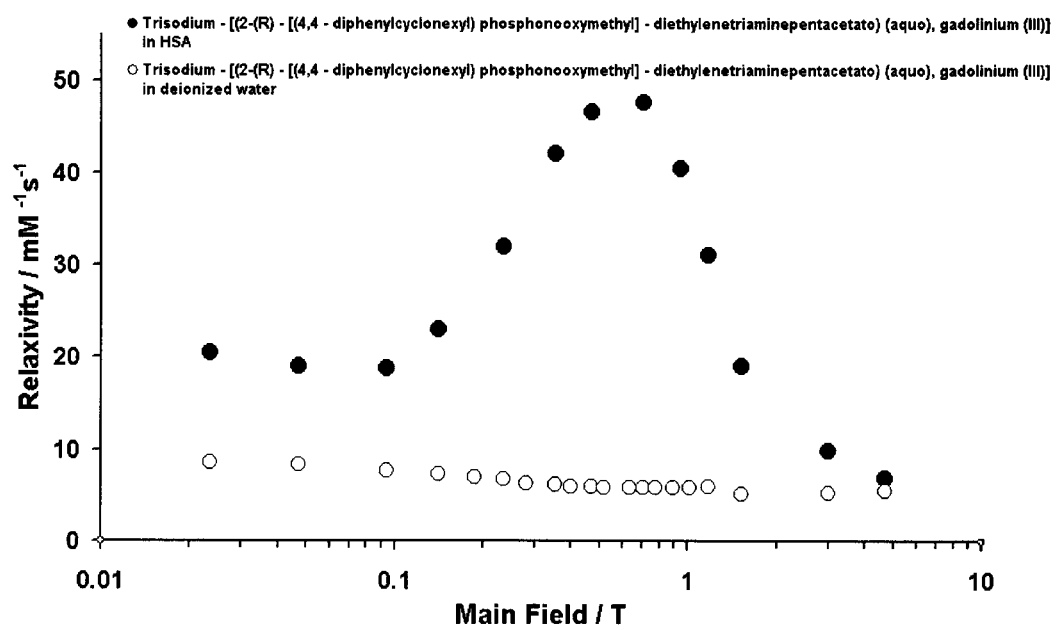
FIG. 3 shows the relaxivity curves for the agent Trisodium-[(2-(R)-[(4,4-diphenylcyclonexyl)phosphonooxymethyl]-diethylenetriaminepentacetato) (aquo), gadolinium (III)] as measured in the presence and absence of human serum albumin (HSA)

TRISODIUM-[(2-(R)-[(4,4-DIPHENYLCYCLON-EXYL)PHOSPHONOOXYMETHYL]-DIETHYLEN-ETRIAMINEPENTACETATO) (AQUO), GADOLINIUM (III)] (3) is an example of a gadolinium chelate that is of similar size to conventional Gd-DTPA; however, by virtue of the addition of a lipophillic diphenylcyclohexyl group, this molecule shows strong non-covalent binding to human serum albumin (HSA). In the presence of HSA, the bound form of this contrast agent demonstrates an increase of relaxivity by approximately an order of magnitude at 30 Mhz, and approximately 4-fold at 60 Mhz. The relaxivity curves of TRISODIUM-[(2-(R)-[(4,4-DIPHENYLCYCLONEXYL) PHOSPHONOOXYMETHYL]-DIETHYLENETRIAMINEPENTACETATO) (AQUO), GADOLINIUM (III)] in the presence and absence of HSA are shown in FIG. 3. In another example, the contrast agent bis-5-HT-DTPA(Gd) has been developed as a "sensor" of the enzyme myeloperoxidase. In the presence of active myeloperoxidase, this contrast agent converts from a monomeric form with minimal protein binding characteristics and relaxivity similar to that of Gd-DTPA, to an oligomeric form with stronger protein binding affinity, leading to enhanced relaxivity.

These two examples of gadolinium-based contrast agents represent the promise of activatable (i.e. "smart" or "sensing") MR contrast agents, but also illustrate a limitation of this class of contrast agents. That is, the activation-induced relaxivity enhancement may be relatively modest, especially at clinical polarizing magnetic field strengths of 1.5 T or 3 T. As a result, it may be difficult to separate image intensity enhancement due to the presence of activated contrast agent from image intensity enhancement due to the presence of larger amounts of non-activated contrast agent.

To characterize the efficiency or quality of an activatable contrast agent, the relaxivity enhancement ratio, that is the ratio of the activated relaxivity to the inactivated relaxivity can be defined. For TRISODIUM-[(2-(R)-[(4,4-DIPHENYLCYCLONEXYL)PHOSPHONOOXYMETHYL]-DIETHYLENETRIAMINEPENTACETATO) (AQUO), GADOLINIUM (III)] at 1 T, the relaxivities in the presence and absence of albumin are 19 $s^{-1}$ $mM^{-1}$ and 5.2 $s^{-1}$ $mM^{-1}$, respectively, resulting in a relaxivity enhancement ratio of 3.7. From FIG. 3 it is clear that the TRISODIUM-[(2-(R)-[(4,4-DIPHENYLCYCLONEXYL)PHOSPHONOOXYMETHYL]-DIETHYLENETRIAMINEPENTACETATO) (AQUO), GADOLINIUM (III)] relaxivity enhancement ratio falls quickly as the polarizing magnetic field is increased from 1 to 4 T. Increasing the relaxivity enhancement ratio increases the ability to distinguish the activated contrast agent from the non-activated contrast agent, and therefore the ability to specifically 'sense' the target.

A substantial increase in contrast agent detection specificity can be achieved by utilizing the slope of the relaxation rate as a source of image contrast. For example, if the relaxivity slope is defined as $r_1'=(dr_1/dB)$, then the relaxivity slope enhancement ratio (ratio of relaxivity slopes between activated and non-activated states) for TRISODIUM-[(2-(R)-[(4,4-DIPHENYLCYCLONEXYL)PHOSPHONOOXYMETHYL]-DIETHYLENETRIAMINEPENTACETATO) (AQUO), GADOLINIUM (III)] at 1 T is −91. This represents a twenty-five (25) times improvement as compared to the more conventional relaxivity enhancement ratio for TRISODIUM-[(2-(R)-[(4,4-DIPHENYLCYCLONEXYL) PHOSPHONOOXYMETHYL]-DIETHYLENETRIAMINEPENTACETATO) (AQUO), GADOLINIUM (III)] at 1 T. Larger relaxivity slope enhancement ratios may be obtainable by further engineering the electrical and structural characteristics of targeted contrast agents.

Just as sample relaxation rate is proportional to relaxivity (Equation 1) so too is relaxation rate slope $R_1'$ proportional to relaxivity slope. This is demonstrated by taking the derivative of Equation 1 with respect to magnetic field, B, as expressed by Equation 2:

$$R_1'=dR_1^0/dB+r_1'*[CA]  \quad \text{Equation 2}$$

Delta relaxation enhanced MRI is a clinically feasible technique that allows direct measurement of contrast agent concentration by utilizing the high relaxivity slope of novel and targeted contrast agents or the high relaxivity slope enhancement ratio of certain activatable contrast agents. Since the relaxation rate slope $R_1'$ values of unenhanced biological tissues are small over the clinical polarizing magnetic field strength range, and show little variation across tissue types, these tissues would display low signal intensity in images that have been sensitized to the relaxation rate slope $R_1'$. On the other hand, certain contrast agents would display high signal intensity due to high relaxivity slope. This feature would improve the visibility of targeted or activated contrast agents, as a lower concentration of contrast agent would be required to surpass the relaxation rate slope $R_1'$ of background tissue. Because of the high relaxivity slope of certain targeted contrast agents or relaxivity slope enhancement ratio of certain activatable contrast agents, delta relaxation enhanced MRI will substantially suppress all signals except those due to the contrast agent, and therefore will yield a map that is selective for the target molecule.

Delta relaxation enhanced MRI works by generating $R_1'$ image contrast using a variable magnetic field-strength magnet, which can be turned on to create small magnetic field perturbations around the static polarizing magnetic field $B_0$ generated by the polarizing electromagnet. These magnetic field perturbations ("ΔB" field) are applied only during magnetization evolution, with image acquisition occurring after magnetization evolution and with the ΔB field turned off, i.e. in the presence of the unaltered static polarizing magnetic field $B_0$. A variable polarizing magnetic field-strength environment can be achieved using a number of MRI technologies including resistive magnet MRI, field-cycled or prepolarized MRI. Alternatively, this variable polarizing magnetic field strength environment can be realized by outfitting superconducting MRI machines that typically generate polarizing magnetic field of a fixed strength with removable auxiliary magnetic field generators capable of temporarily varying the polarizing magnetic field strength experienced by a sample, as will be discussed below.

The delta relaxation enhanced MRI method is not limited to $R_1'$ contrast or gadolinium-based contrast sensing agents, but is a method for generating image contrast for any tissue, substance or contrast agent parameter that shows magnetic field dependence. For instance some ferromagnetic contrast agents demonstrate magnetic field dependent transverse relaxivity providing another potential source of delta relaxation enhanced MRI contrast. However, for illustrative purposes the following discussion will be limited to $R_1'$ contrast, accessed with small magnetic field perturbations about the static polarizing magnetic field.

Visualizing $R_1$ magnetic field-dependence requires exposure of the imaging sample to multiple polarizing magnetic field strengths. The simplest method involves voxel-by-voxel magnitude subtraction of two $T_1$-weighted images, with each $T_1$-weighted image being derived from a scan utilizing a different static polarizing magnetic field $B_0$ during the longitudinal recovery period of the pulse sequence.

Figure 4:
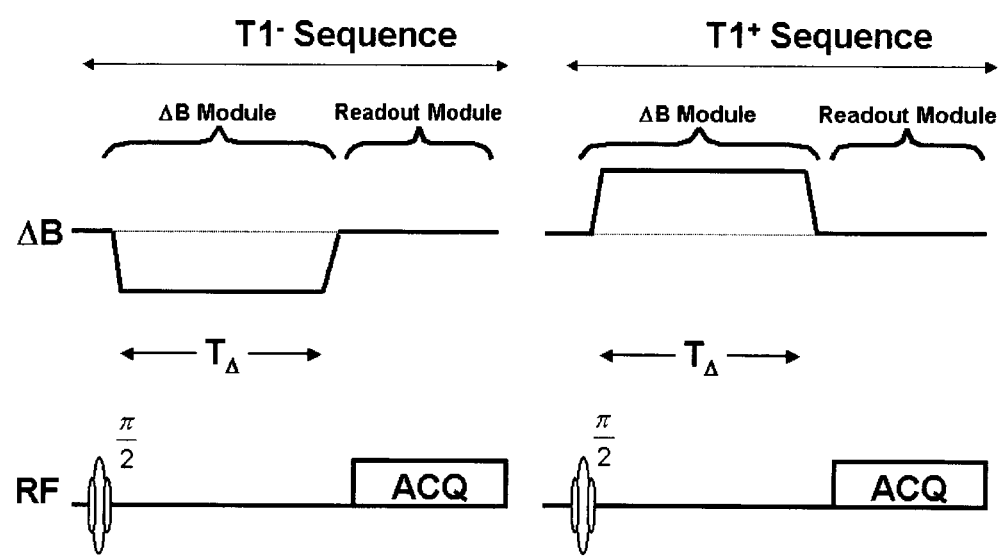
FIG. 4 shows the change in static polarizing magnetic field strength required for detection of $R_1'$, where the $T_1^-$ and the $T_1^+$ pulse sequences are $T_1$-weighted pulses and where $\Delta B$ pulses of duration $T_A$ modify the strength of the static polarizing magnetic field strength prior to the readout module.

In FIG. 4, two pulse sequences are shown, namely the $T_1^-$ sequence and the $T_1^+$ sequence. Both pulse sequences resemble $T_1$-weighted sequences, however in the $T_1^-$ sequence a −ΔB pulse is applied during longitudinal magnetic relaxation $T_A$; while in the $T_1^+$ sequence a +ΔB pulse is applied during longitudinal magnetic relaxation $T_A$. Each pulse sequence contains a preparatory module during which the polarizing magnetic field $B_0$ is modified, as well as a self-contained acquisition pulse sequence module such as a gradient-echo, spin-echo or any other conventional imaging sequence. The preparatory module is referred to as the ΔB module while the remainder of the pulse sequence is referred to as the readout module. Each ΔB module begins with a saturation radio frequency (RF) pulse to eliminate any preexisting longitudinal magnetization. A variation of the pulse sequence may replace the saturation pulse with an inversion pulse. In this derivation the ramping times of the ΔB pulses are ignored so that the final magnetization can be written analytically.

Voxel magnetizations, at the completion of the ΔB module for the $T_1^-$ and $T_1^+$ sequences, are proportional to the steady state longitudinal magnetization ($M_0$) for the static polarizing magnetic field strength. Modification of the static polarizing magnetic field $B_0$ directly affects the steady state longitudinal magnetization $M_0$. Therefore, the steady state longitudinal magnetization $M_0$ is reduced by a factor of $(B_0-\Delta B)/B_0$ for the $-\Delta B$ pulse and increased by a factor of $(B_0+\Delta B)/B_0$ for the $+\Delta B$ pulse. In Equations 3 and 4 below, $M_0$ refers to the steady state longitudinal magnetization for the static polarizing magnetic field $B_0$ about which the ΔB pulses are applied:

$$M_{z-} = M_0 \cdot \frac{B_0 - \Delta B}{B_0}\left[1 - e^{(-T_\Delta(R_1 - \Delta B \cdot R_1'))}\right] \quad \text{Equation 3}$$

$$M_{z+} = M_0 \cdot \frac{B_0 + \Delta B}{B_0}\left[1 - e^{(-T_\Delta(R_1 - \Delta B \cdot R_1'))}\right] \quad \text{Equation 4}$$

Magnetization is transformed into voxel intensity by the combined actions of the readout module (ACQ), MRI machine signal detection hardware and console software. For simplicity it will be assumed that the final image intensity is a product of voxel magnetization, proton density, and a positional dependent gain term ζ which incorporates $B_1$ shading, $B_0$ homogeneity, Larmor frequency, gradient performance, preamp gain and any other scaling factors. The resulting image intensity in each pixel I(x, y) is then related to voxel magnetization and expressed as $I(x, y) = \zeta x, y, r \cdot Mz(r) \cdot \rho(r)$. Therefore, the voxel intensity maps or images $I^-$ and $I^+$ resulting from the pulse sequences $T_1^-$ and $T_1^+$ can be written as:

$$I^- = \xi \cdot \rho \cdot M_0 \cdot \frac{B_0 - \Delta B}{B_0}\left[1 - e^{(-T_\Delta(R_1 - \Delta B \cdot R_1'))}\right] \quad \text{Equation 5}$$

$$I^+ = \xi \cdot \rho \cdot M_0 \cdot \frac{B_0 + \Delta B}{B_0}\left[1 - e^{(-T_\Delta(R_1 + \Delta B \cdot R_1'))}\right] \quad \text{Equation 6}$$

The first step in forming the $R_1'$ map is to take the weighted difference of the $I^-$ and $I^+$ images. Due of the different equilibrium magnetization, introduced by the perturbation field, the images $I^-$ and $I^+$ must be normalized prior to subtraction. This requires that image $I^-$ be multiplied by $B_0/(B_0-\Delta B)$ and image $I^+$ be multiplied by $B_0/(B_0+\Delta B)$. The difference intensity map $I_{Diff}$ of the images is given by the expression $I_{Diff} = B_0/(B_0-\Delta B) \cdot I^- - B_0/(B_0+\Delta B) \cdot I^+$. Writing the expression $I_{Diff}$ explicitly in terms of Equations 5 and 6 results in the expression $I_{Diff} = 2\zeta \cdot M0 \cdot \rho \cdot \sinh(-T_\Delta \cdot \Delta B \cdot R_1') \cdot \exp(-T_\Delta \cdot R_1)$. For typical ranges of $T_\Delta$ (100-300 ms) ΔB (50 to 200 mT) and $R_1'$ (0 to 10 $(Ts)^{-1}$) $\sinh(T_\Delta \cdot \Delta B \cdot R_1')$ can be approximated by $T_\Delta \cdot \Delta B \cdot R_1'$ with less than a 5% error. As well, when $R_1'$ is negative, the expected case for clinical polarizing magnetic field strengths, $R_1' = -|R_1'|$. Therefore, the expression $I_{Diff}$ can be approximated by:

$$I_{Diff} \cong 2\xi \cdot M_0 \cdot \rho \cdot \Delta B \cdot |R_1'| \cdot T_\Delta \cdot e^{-T_\Delta \cdot R_1} \quad \text{Equation 7}$$

Equation 7 shows that the intensity of the $T_1$-weighted difference image $I_{Diff}$ is linear with proton density (ρ), gain (ζ)ΔB, $R_1'$ and $T_\Delta$ while being inversely proportional to the exponential of $T_\Delta \cdot R_1$. Image darkening, or shading caused by the $T_\Delta \cdot R_1$ term can be minimized by keeping $T_\Delta$ short. For example, if the maximum $R_1$ value of the sample has a value of $R_{1max}$ and the user requires that the maximum $R_1$ shading be less than 30% then the longest allowed $T_\Delta$ is $\ln(100/(100-30))/R_{1max}$, where ln( ) is the natural logarithm.

Figure 5:
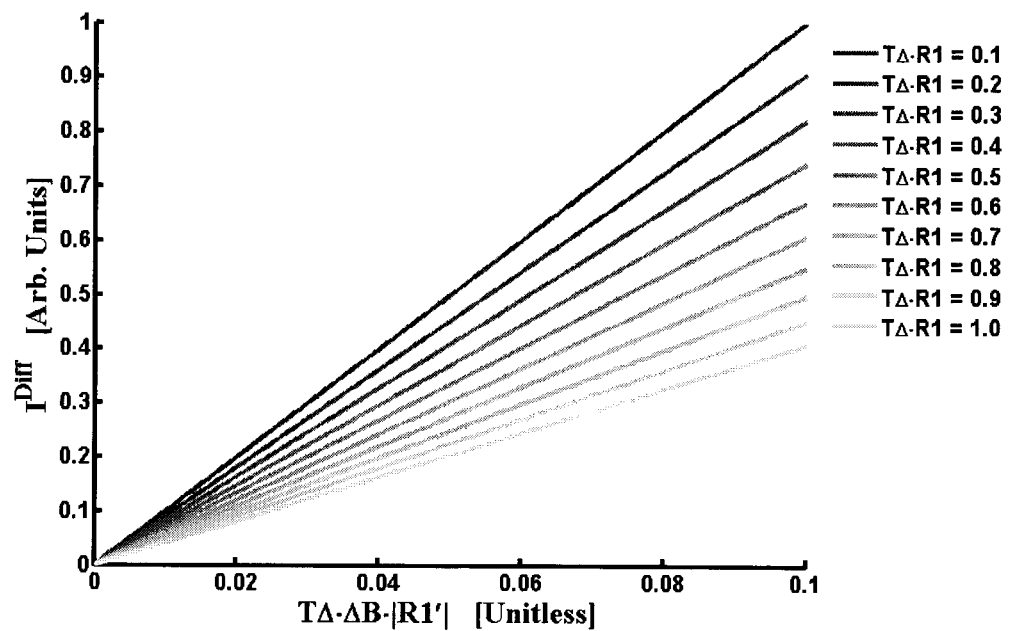
FIG. 5 shows $R_1$ shading of IDiff for different values of $T_A R_1$.

FIG. 5 illustrates $R_1$ shading of the difference intensity map $I_{Diff}$ for different values of $T_\Delta \cdot R_1$. As shown, when $R_1' = 0$, $I_{Diff}$ goes to zero independent of the value for $R_1$. This feature is important when 'nulling' biological tissues since they typically have small $R_1'$ values.

The uncertainty is $I_{Diff}$ can be found analytically by propagation of uncertainty from images $I^-$ and $I^+$ with the error propagation formula. Let the uncertainty in Equations 5 and 6 be written as $\sigma_-$ and $\sigma_+$ respectively. Due to the need to scale image $I^-$ by $B_0/(B_0-\Delta B)$ and image $I^+$ by $B_0/(B_0+\Delta B)$ prior to subtraction, the uncertainty in $I_{Diff}$ is weighted differently for each source. Writing $c_- = B_0/(B_0-\Delta B)$ and $c_+ = B_0/(B_0+\Delta B)$ yields:

$$\sigma_{Diff} = \sqrt{\sigma_-^2 \cdot c_-^2 + \sigma_+^2 \cdot c_+^2} \quad \text{Equation 8}$$

If the uncertainties in images $I^-$ and $I^+$ are equal and $|\Delta B| \ll$ of $B_0$, $\sigma_{Diff}$ is safely approximated by $\sigma_{Diff} = \sqrt{2} \cdot \sigma$, where $\sigma = \sigma_- = \sigma_+$. The signal to noise ratio (SNR) of $I_{Diff}$ is therefore written as Equation 7 divided by Equation 8:

$$SNR_{Diff} \cong \frac{\sqrt{2}}{\sigma} \cdot \xi \cdot M_0 \cdot \rho \cdot \Delta B \cdot |R_1'| \cdot T_\Delta \cdot e^{-T_\Delta \cdot R_1} \quad \text{Equation 9a}$$

In order to estimate the SNR of a single scan, the uncertainty σ must be expressed in terms of the maximum signal intensity produced by the MRI system. Let δ represent the percentage uncertainty, $\delta = 100 \cdot \sigma/(\zeta_{max} \cdot M_0 \cdot \rho_{max})$. When the proton density and the gain factor change little over the image, the SNR can be expressed as:

$$SNR_{Diff} \cong \frac{\sqrt{2}}{\delta} \cdot 100 \cdot \Delta R_1 \cdot T_\Delta \cdot e^{-T_\Delta \cdot R_1} \quad \text{Equation 9b}$$

To simplify the final form of Equation 9b, the product $\Delta B \cdot |R_1'|$ in Equation 9a is expressed as $\Delta R_1$.

Now it is possible to apply an approximate number to the SNR for a particular set of tissue parameters. For example, suppose a tissue sample has a $\Delta R_1$ value of 1 s$^{-1}$, an $R_1$ value of 5 s$^{-1}$ and suppose a ΔB pulse of 200 ms is applied, the resulting image would have an SNR of approximately 10/δ. If the original images had a maximum possible SNR of 100 (intensity=100, δ=1), then the maximum possible SNR of the difference map would only be 10.

The SNR expression in Equations 9a and 9b is for a single acquisition. For multiply acquisitions the SNR increases by the root of the number of averages (NEX). The number of averages is equal to the total scan duration divided by the $I_{Diff}$ scan duration. The $I_{Diff}$ scan time is $2 \cdot T_\Delta \cdot$ number of k-space rows per image. Therefore, the SNR can be written as:

$$SNR_{Diff} \cong \frac{1}{\delta} \cdot 100 \cdot \Delta R_1 \cdot \sqrt{T_\Delta} \cdot e^{-T_\Delta \cdot R_1} \cdot \sqrt{\frac{\text{Total Scan Time}}{\text{Num. Rows}}} \quad \text{Equation 9c}$$

The SNR is maximized for a particular $R_1$ value by choosing $T_\Delta$ such that $T_\Delta = 1/(2 \cdot R_1)$. Putting this expression into Equation 9c gives:

$$SNR_{Diff} \cong \frac{100}{\delta \cdot e^{1/2}} \cdot \frac{\Delta R_1}{\sqrt{2R_1}} \cdot \sqrt{\frac{\text{Total Scan Time}}{\text{Num. Rows}}} \quad \text{Equation 9d}$$

$R_1'$ Isolation:

The subtraction method successfully cancels pixel intensity in locations where $R_1'$ is zero, independent of $R_1$ or proton density. This is potentially useful in allowing discrimination of tissue locations where no $R_1'$ enhancement has occurred. However, $R_1$ shading prevents quantitative measure of $R_1'$. Depending on the particular application, $R_1$ shading may or may not be problematic. When $R_1$ shading is problematic, the $\exp(-T_A \cdot R_1)$ term in Equations 7 and 9 must be removed. One method for achieving this result requires the division of $I_{Diff}$ by the difference of a proton-weighted image and a $T_1$-weighted image where the TR of the $T_1$-weighted image is $T_A$. This difference is given by the equation:

$$I_{PD-T1} = \xi \cdot M_0 \cdot \rho [e^{-T_A \cdot R_1} - e^{-T_p \cdot R_1}] \quad \text{Equation 10}$$

The term TP in Equation 10 indicates the repletion time (TR) of the proton density weighed scan. Dividing $I_{Diff}$ (Equation 7) by $I_{PD-T1}$ (Equation 10) produces the $R_1'$ map $I_{R1'}$, where proton density, system-gain and $R_1$ shading have been eliminated as expressed by:

$$I_{R1'} \cong 2 \cdot \Delta B \cdot |R_1'| \cdot T_\Delta \cdot \varepsilon \quad \text{Equation 11}$$

$$\varepsilon = \frac{1}{1 - e^{-(T_p \cdot T_\Delta)R_1}}$$

While the $I_{Diff}$ map demonstrates significant shading in areas of high $R_1$, the $I_{R1'}$ map experiences only minor $R_1$ brightening in regions where $R_1$ is low. This brightening results from a slight over-correction due to the finite TR of the proton density weighted image. The magnitude of the brightening is determined by the brightening factor $\epsilon$. The brightening effect can be made arbitrarily small by forcing $\epsilon$ to unity by lengthening $T_P$. The cost of lengthening $T_P$ is an increase in total scan time. For any $T_\Delta$ and $\epsilon_{max}$, $T_P = T_\Delta + \ln(\epsilon_{max}/(\epsilon_{max}-1))/R_{1min}$. For example, for $T_\Delta = 200$ ms, $R_{1min} = 1$ s$^{-1}$ and the maximum accepted brightening is 5% (i.e. $\epsilon = 1.05$) $T_P$ must be greater or equal to 3.2 s.

The variation in $I_{R1'}$ can be derived with the error propagation equation. Writing $\sigma_{T1}$ and $\sigma_{PD}$ as the uncertainties of the pixel intensities of the images $I_{T1}$ and $I_{PD}$ then the variance in $I_{R1'}$ is given by:

$$\sigma_{R1'}^2 = \left(\frac{1}{I_{PD-T1}}\right)^2 \cdot [\sigma_-^2 \cdot c_-^2 + \sigma_+^2 \cdot c_+^2 + (\sigma_{T1}^2 + \sigma_{PD}^2) \cdot I_{R1'}^2] \quad \text{Equation 12}$$

From Equation 12 it can be seen that the contribution of uncertainty from each source affects the $R_1'$ map differently. The following example aids in understanding the relative weighting of each source. For $\Delta B = 0.1$ T, $T_\Delta = 200$ ms and $|R_1'_{max}| = 5$ (T s)$^{-1}$ $R_1'$ map intensity, $I_{R1}$ is 0.2. Therefore the relative contributions are:

$$\sigma_D^2 \propto (1.23 \cdot \sigma_-^2 + 0.83 \cdot \sigma_+^2 + 0.04 \cdot \sigma_{T1}^2 + 0.04 \cdot \sigma_{PD}^2) \quad \text{Equation 13}$$

The variance of $I_{R1'}$ is thirty-one (31) times more dependent on the I$^-$ image and twenty-one (21) times more dependent on the I$^+$ image than on the $I_{PD}$ or $I_{T1}$ images. Therefore, any averaging must take into account the relative contributions from each source. Averaging the I$^-$ or I$^+$ images will have the most impact in lowering noise in $I_{R1'}$, while averaging $I_{PD}$ or $I_{T1}$ will have little effect. If the assumptions are made that i) the uncertainties from each constituent image are all the same ($\sigma$) and that ii) the relative contributions from $I_{PD}$ and $I_{T1}$ are small enough to ignored, then the uncertainty in $I_{R1'}$ can be approximated by $\sqrt{2} \cdot \sigma / I_{PD-T1}$. If $I_{PD-T1}$ is written in terms of $\epsilon$ then the $R_1'$ map uncertainty is:

$$\sigma_{R1'} = \sqrt{2} \cdot \sigma / (\xi \cdot M_0 \cdot \rho) \cdot e^{T_\Delta \cdot R_1} \cdot \epsilon \quad \text{Equation 14}$$

Dividing the image intensity in Equation 11 by the uncertainty of Equation 14, the SNR of the $R_1'$ map can be written as:

$$SNR_{R1'} \cong \frac{\sqrt{2}}{\sigma} \cdot \xi \cdot M_0 \cdot \rho \cdot \Delta B \cdot |R_1'| \cdot T_\Delta \cdot e^{-T_\Delta \cdot R_1} \quad \text{Equation 15a}$$

Or, as before, in terms of the percentage uncertainty $\delta$ and with uniform $\zeta$ and $\rho$ assumed:

$$SNR_{R1'} \cong \frac{\sqrt{2}}{\delta} \cdot 100 \cdot \Delta R_1 \cdot T_\Delta \cdot e^{-T_\Delta \cdot R_1} \quad \text{Equation 15b}$$

A comparison of Equation 9b and Equation 15b demonstrates that the SNR expressions for the $R_1'$ map and the difference map are identical. This should be expected since the uncertainty components from $I_{PD}$ and $I_{T1}$ were ignored in producing Equation 15. But while the equations are the same, their meanings are different. In Equation 9 the intensity of the difference map, $I_{Diff}$ is dependent directly on $R_1$, while pixel uncertainty is constant across the image. In Equation 11 the intensity of the $R_1'$ map is independent of $R_1$ (except for $\epsilon$), proton density, and gain $\zeta$, however the uncertainty is not constant over the $R_1'$ map but increases with $\exp(T_\Delta \cdot R_1) \cdot \epsilon$. Transitioning from the simple difference map to the $R_1'$ map drastically increases the imaging time. Consider the following example where the time requirements for the readout module are ignored for simplicity: For a $T_\Delta = 200$ ms and Tp=3.2 s, and a readout module which fills k-space one row per $\Delta B$ pulse, the difference map $I_{Diff}$ would only require about 50 s while $I_{R1'}$ map would require approximately 8 minutes.

The SNR equations derived so far are for single datasets. Typically, when averaging occurs the SNR increases as the root of the number of averages. However, averaging of the constituent images I$^-$ I$^{+1}$ $I_{T1}$ and $I_{PD}$ can affect the SNR of the $R_1'$ map differently. This can be seen in the relative contributions to $\sigma_{R1'}^2$ in Equation 12. Rather than ignoring the contribution from $\sigma_{PD}$ and $\sigma_{T1}$, these sources of uncertainty should be increased by $(1/I_{R1'})^2$ so that each source contributes equally to the final uncertainty.

Using a fast spin echo method, multiple rows of k-space of the proton density image can be filled at a rate of $(1/I_{R1'})^2$ lines for every $\Delta B$ module. Filling $(1/I_{R1'})^2$ rows of k-space per readout module increases $\sigma_{PD}$ and $\sigma_{T1}$ such that the SNR of the $R_1'$ map is decreased by $\sqrt{2}$. Even though the SNR has decreased by $\sqrt{2}$, total imaging time has been reduced to approximately the scan duration of the of difference map $I_{Diff}$. In comparison to the previous example, the scan duration has been reduced from eight (8) minutes to just over one (1) minute. Therefore, the SNR of the $R_1'$ map is approximately $1/\sqrt{2}$ of SNR for the difference map for the same imaging time. Once again, the SNR can be expressed in terms of total scan time and optimize $T_\Delta$ such that:

$$SNR_{R1'} \cong \frac{100}{2 \cdot \delta \cdot e^{1/2}} \cdot \frac{\Delta R_1}{\sqrt{R_1}} \cdot \sqrt{\frac{\text{Total Scan Time}}{\text{Num. Rows}}} \quad \text{Equation 15c}$$

This SNR expression simply depends on $DR_1$, $R_1$, the total scan time and the number of rows per scan.

Figure 6:
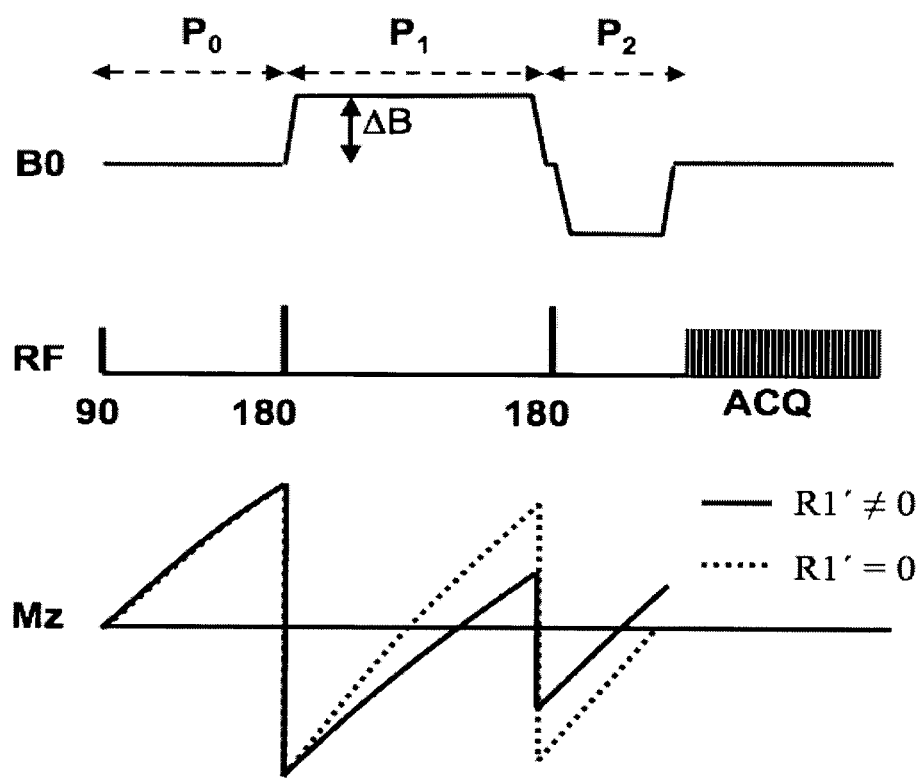
FIG. 6 shows the total magnetic field, applied RF pulses, and longitudinal magnetization during a single (double inversion recovery) DIR delta relaxation enhanced MR pulse sequence.

There are several pulse-sequence implementations of delta relaxation enhanced MRI that do not require subtraction of images. For exemplary purposes, described below is a double inversion recovery (DIR) preparation method with variable length bipolar polarizing magnetic field shifts of equal but opposite amplitudes $\pm\Delta B$. The DIR sequence has three periods of magnetic evolution as shown in FIG. 6. The upper time series, labeled B0, illustrates the static polarizing magnetic field $B_0$ during each period. The imaging sample is exposed to the static polarizing magnetic field strength for a period $P_0$. For the durations $P_1$ and $P_2$ the polarizing magnetic field strength is first increased and then decreased by $\Delta B$. The second time series of FIG. 6 details the RF pulses that are applied around these polarizing magnetic field perturbations. All RF pulses are applied at a time when the polarizing magnetic field is at its unaltered static magnetic field strength, signifying that no modifications to the RF hardware of the clinical MRI machine are required. The initial 90° RF pulse resets longitudinal magnetization, while the following 180° pulses and associated magnetic field pulses and evolution periods serve to null the longitudinal magnetization of all non-activated tissues ($R_1' \approx 0$) while maximizing magnetization of activated tissues ($R_1' \neq 0$) by the beginning of the acquisition period. The lower time series of FIG. 6 represents the temporal evolution of longitudinal magnetizations for tissues demonstrating non-zero $R_1'$ (solid line) and tissues demonstrating zero $R_1'$ (dashed line). At the completion of the DIR sequence, the magnetization is proportional to $R_1'$ but not to $R_1$.

To facilitate comparison of the delta relaxation enhanced MR DIR sequence against standard $T_1$-weighted sequences, a computer simulation is used to solve the Bloch equations to predict magnetization for any arbitrary pulse sequence (see Reference 4). For the simulation, $T_1$ values were modeled using Bottomley's tissue model (see Reference 5), while contrast agent relaxivities were simulated based on published models. The relative magnetizations of blood+0.15 mM of blood-protein activated contrast agent, fat, muscle, white-matter (WM), and grey-matter (GM) were calculated for a $T_1$-weighted sequence (TR=300 ms) and a DIR delta relaxation enhanced MR sequence (B0=1.5 T, $\Delta B$=0.15 T).

Figure 7A:
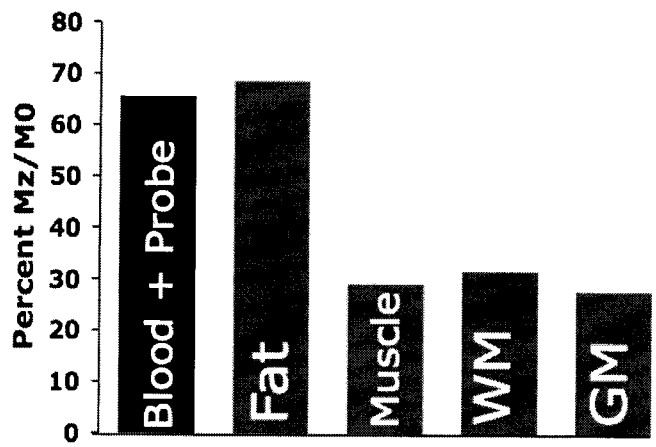
FIG. 7a shows the relative magnetization produced from a $T_1$-weighted sequence (TR=300 ms)
Figure 7B:
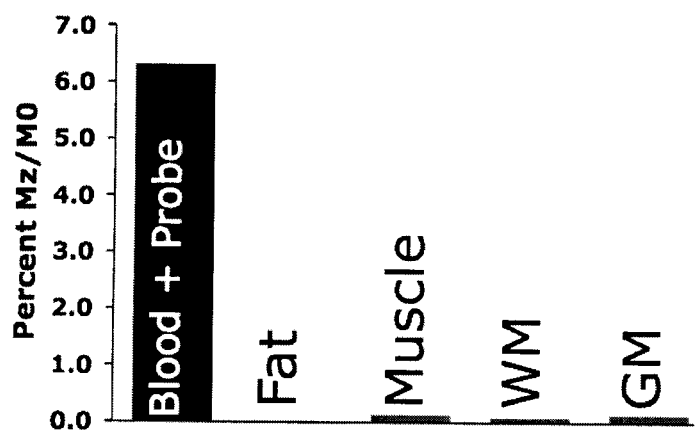

FIGS. 7a and 7b show the relative magnetizations generated by a standard $T_1$-weighted sequence and a DIR delta relaxation enhanced MR sequence, respectively. The $T_1$-weighted sequence shown in FIG. 7a is insufficient to separate the enhanced blood from typical biological tissues. Conversely, in FIG. 7b the DIR delta relaxation enhanced MR sequence generates magnetization for the activated contrast agent while effectively suppressing magnetization in the unenhanced biological tissues or the non-activated contrast agent (not shown).

To demonstrate the feasibility of the delta relaxation enhanced magnetic resonance (dreMR) image acquisition approach, the contrast agent Vasovist or MS-325 (Baxter Healthcare Pharmaceuticals, Gadofosveset trisodium) was imaged in the presence and absence of rabbit serum albumin (RSA). Vasovist preferentially binds to albumin, producing moderate enhancement in the inactivated state and higher enhancement in the activated state. The particular choice of contrast agent/protein pair was based by the availability of the contrast agent and its well-documented relaxivity mechanisms, rather than any specific clinical or research interest in albumin.

An MRI phantom (see FIG. 8a) was constructed that held two columns of six rows of glass tubes; each tube 3 cm in length with a 0.4 mL capacity. The sample tubes in the left column were filled with 0.01 M phosphate buffered saline (PBS) (NaCl 0.138M, KCl 0.0027M, pH 7.4 at 25° C.). The right column of sample tubes held a solute of rabbit serum albumin (Sigma-Aldrich, batch 104K7560, agarose gel electrophoresis) in PBS. The albumin, purchased as a lyophilized powder, was dissolved in PBS, at a 4.5% weight to volume ratio resulting in ~0.67 mM concentration. Vasovist (0.25 mmol/mL) was added in equal concentration to both columns to achieve sample concentrations of 0, 10, 20, 40, 80 and 160 µM as a function of descending rows.

Figure 9A:
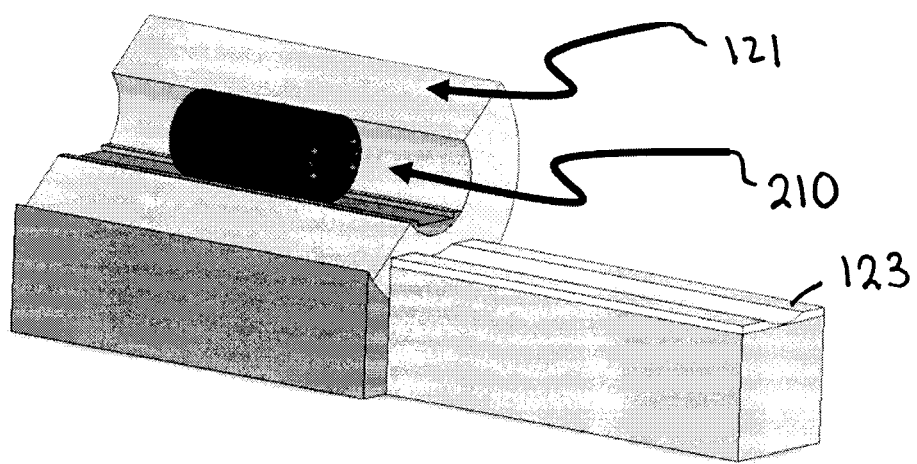
FIG. 9a shows a portion of the MRI machine cutaway and an auxiliary magnetic field generator inserted into the MRI machine.

Imaging was performed on a Sigma LX 1.5 T clinical MRI machine (General Electric Healthcare), equipped with an actively shielded auxillary magnetic field generator 210 inserted into the bore in the cryostat 121 of the MRI machine as shown in FIG. 9a. The auxillary magnetic field generator 210, designed to generate $\pm\Delta B$ magnetic field pulses, had an efficiency of 0.7 mT/A, weighed approximately 150 kg and was designed to facilitate the imaging of animals as large as rabbits. The auxillary magnetic field generator was driven by a pair of Techron 8607 gradient amplifiers configured in a master/slave series configuration enabling a maximum bipolar output of 100 A. Input waveforms to the amplifiers were generated by National Instruments data acquisition hardware and controlled via custom software written in LabView (National Instruments, version 8.2). Waveform synchronization between the data acquisition device and the MRI operator console was achieved by means of the 'scope trigger' output of the console electronics.

The following spin-echo pulse sequence parameters were used for all images that were combined to produce the final dreMR image: 150 ms pulse repetition time, 10 ms echo time, 31 kHz bandwidth, 8 cm field of view and 10 mm slice thickness. The scan time was 24 s for each image. For each row of k-space, 70 mT $\Delta B$ pulses were applied for 100-ms intervals. The $\Delta B$ magnetic field pulses were timed to end 10 ms prior to image acquisition to allow both the polarizing magnetic field and amplifiers time to stabilize.

For $T_1^+$ images the polarizing magnetic field was increased by 70 mT during the relaxation portion of the pulse sequence. Likewise for $T_1^-$ images the polarizing magnetic field was decreased by the same amount. Ten pairs of $T_1^+$ and $T_1^-$ weighted images were acquired for the samples held at 21° C. Acquisitions of $T_1^+$ and $T_1^-$ enhanced images were interleaved to minimize heating of the gradient amplifiers. The positively enhanced images were then averaged into a single dataset, as were the negatively enhanced images. The resulting two datasets were normalized and the absolute difference taken to produce contrast related to the magnetic field dependence of $R_1$. Unlike in the theoretic treatment a saturation pulse was not applied prior to the $\Delta B$ magnetic field pulse. Standard $T_1$-weighted spin echo images using the same pulse sequence parameters were acquired for comparison.

FIG. 8b shows the standard $T_1$-weighted spin-echo image of the samples. As expected, the intensity of both columns increased from top to bottom with concentration of Vasovist. The measured average intensity within each sample is plotted in FIG. 8d. The error bar on each data point indicates the standard deviation of voxel intensity throughout the corresponding sample. Both sets of samples, albumin solution and PBS, demonstrated significant dependence on Vasovist concentration. Because the range of intensities of the albumin samples (▲) were not clearly separated from those of the PBS samples (●) but in fact were appreciably overlapped, it is clear that without prior knowledge of Vasovist concentrations, it would not be possible to differentiate the albumin-containing sample from PBS-only samples based on $T_1$-weighted image intensity alone.

FIG. 8c illustrates the absolute difference of the ±ΔB datasets. The figure shows the entire dynamic range without thresholding. The average intensity from each of the samples is plotted in FIG. 8e. The standard deviation of voxel intensities within each sample is again expressed as an error bar. While the image intensity of albumin samples continued to demonstrate dependence on Vasovist concentration, the PBS samples where significantly suppressed. The intensities of all PBS samples were suppressed well below the intensity of the weakest albumin-loaded sample, which had only a 10 µM Vasovist concentration. Thus a substantially increased specificity to albumin was obtained through dreMR imaging.

Intensity variations in the dreMR image were seen to increase by a factor of 2.5 times those of the $T_1$-weighted image as indicated by the larger error bars in FIG. 8e compared to FIG. 8d. This was due to the combined effects of SNR loss and introduction of subtraction artefacts. Subtraction artefacts appear as a mottling across the samples and are due to instabilities in the polarizing magnetic field $B_0$ during image acquisition; instabilities most likely introduced by rapid switching of the auxillary magnetic field generator. Subtraction artefacts were localized to positions having significant image intensity in the constituent images whereas noise increased across the entire image. Even with active shielding, minor inductive coupling between the auxiliary magnetic field generator and the MRI machine has the potential to produce eddy currents in the cryostat and superconductive windings of the polarizing magnet. These eddy currents could destabilize the main polarizing magnetic field, causing minor slice selection errors and errors in the radio frequency tip angle. To counter this potential problem, the auxillary magnetic field generator was used as an active shim during image acquisition.

As mentioned above, exploitation of the benefits of delta relaxation enhanced MR in clinical static polarizing magnetic field MRI machines is achievable through the addition of an actively shielded auxiliary magnetic field generator. With carefully timed polarizing magnetic field shifts during evolution of longitudinal magnetization, and through the use of contrast agents that exhibit high relaxivity slope at the working polarizing magnetic field strength, it is possible to produce images in which all tissue signals are suppressed except those due to the activated contrast agent. Furthermore, if the contrast agent demonstrates a high relaxivity slope enhancement ratio, then it is possible to produce images in which both non-enhanced tissue signals and non-activated contrast agent signals are suppressed, allowing selective highlighting of the activated contrast agent.

The actively shielded auxillary magnetic field generator 210 in this embodiment is removably inserted into the bore of the MRI machine and comprises a primary electromagnet for producing magnetic fields that shift the strength of the polarizing magnetic field in opposite directions and an active shield to inhibit unwanted magnetic field penetration into the cryostat of the MRI machine. As mentioned above, varying magnetic fields entering the cryostat of the MRI machine would inevitably produce eddy currents that could be strong enough to produce image artefacts for up to several seconds. Also, the additional flux inside the MRI machine has the potential to quench the polarizing electromagnet. The primary electromagnet is controlled by a power amplifier such that it can be driven to produce an auxiliary magnetic field (either positive or negative) that alters the strength of the static polarizing magnetic field of the MRI machine. As mentioned previously, the auxillary magnetic field generator 210 exhibits an efficiency of 0.7 mT/A and permits continuous polarizing magnetic field shifts of up to 70 mT. Higher polarizing magnetic field shifts are achieved by a reduction of the duty cycle of the auxillary magnetic field generator. The primary electromagnet can be conditioned to produce any arbitrary magnetic field waveform as a function of time, enabling field-cycled style $T_1$-dispersion-slope imaging in static polarizing magnetic field superconducting MRI machines.

By temporally modulating the static polarizing magnetic field of the MRI machine, the auxillary magnetic field generator permits access to unique field-cycled contrasts that are rarely investigated due to the scarcity of field-cycled systems. Further discussions of field-cycled contrasts are discussed in Gilbert, K M et al. Phys. Med. Biol. 51 (2006) 2825-2841 and Scott G, et al. Proc. Int. Soc. Magn. Reson. Med. (Glasgow, Scotland) vol. 9, page 610, the contents of which are herein incorporated by reference.

Main polarizing magnetic field homogeneity is less of a concern for delta $R_1$ contrast where polarizing magnetic field shifts are required only during the evolution of longitudinal tissue magnetization, and are absent during the signal acquisition. The rapid ramping of coils of the auxiliary magnetic field generator however, can produce eddy-currents capable of producing main polarizing magnetic field instability during image acquisition. Complete elimination of eddy-currents requires that the auxiliary magnetic field generator produce an insignificant magnetic field outside of its radial extent. From a computational standpoint this is equivalent to requiring zero net flux outside the auxillary magnetic field generator.

Figure 9B:
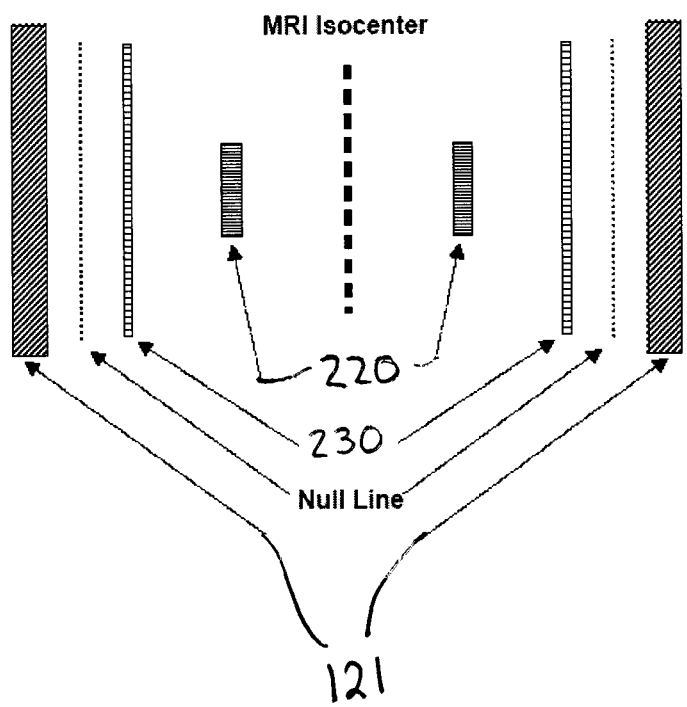
FIG. 9b is a cross sectional representation of a portion of the MRI machine and the auxiliary magnetic field generator.

The considerations taken into account during design of the auxiliary magnetic field generator in order to minimize the external net flux of the auxiliary magnetic field generator will now be described. Referring to FIG. 9b, for achieving the desired active shield a boundary line inside the radius of the coils of the polarizing electromagnet at which the total magnetic field should be made to be practically zero is chosen. Past the null line the magnetic field is approximately zero. By nulling the magnetic field at the null line, the total flux inside the cryostat is also zero. Start with n conducting loops of radius R positioned at equal distances along the z-axis, spanning the isocentre of the system spanning a distance L from the first to the last loop. The loops are equally spaced at a distance of Δx=L/(n−1). Ideally Δx is chosen to be the wire diameter of the conductor that is to be used in the shield. A matrix K is generated using the Biot-Savart Law that contains the z component of the magnetic field at m sample points along the null line. $K_{ij}$ represents the magnetic field produced at the $j^{th}$ sample point when 1 A of current is passed through the $i^{th}$ loop. Multiplying the array K by a current vector I, specifying the current in each loop, produces a column vector B, the magnetic field at each point in along the null line. Mathematically this is written as the following expression:

$$\begin{bmatrix} K \end{bmatrix}_{mn} \cdot \begin{bmatrix} I \end{bmatrix}_n = \begin{bmatrix} B \end{bmatrix}_m \qquad \text{Equation 16}$$

The matrix K should be though of as the efficiency matrix giving the efficiencies of the shield loops at point on the null line. Let B be a column vector specifying the z component of the magnetic field at each of the m sample point along the null line generated by the primary magnet while carrying a current of 1 A.

The job of the active shield is to reduce the magnetic field at the null line by producing the opposite magnetic field at the same points. To achieve this it is necessary to find the currents I such that:

$$\begin{bmatrix} I \end{bmatrix}_n = \begin{bmatrix} K \end{bmatrix}^*_{nm} \cdot \begin{bmatrix} -B \end{bmatrix}_m \quad \text{Equation 17}$$

Though n and m may be chosen to be equal such that the inverse of K is easily calculated, it is not required. The pseudo-inverse of K can be calculated using well-established singular value decomposition methods.

Figure 10:
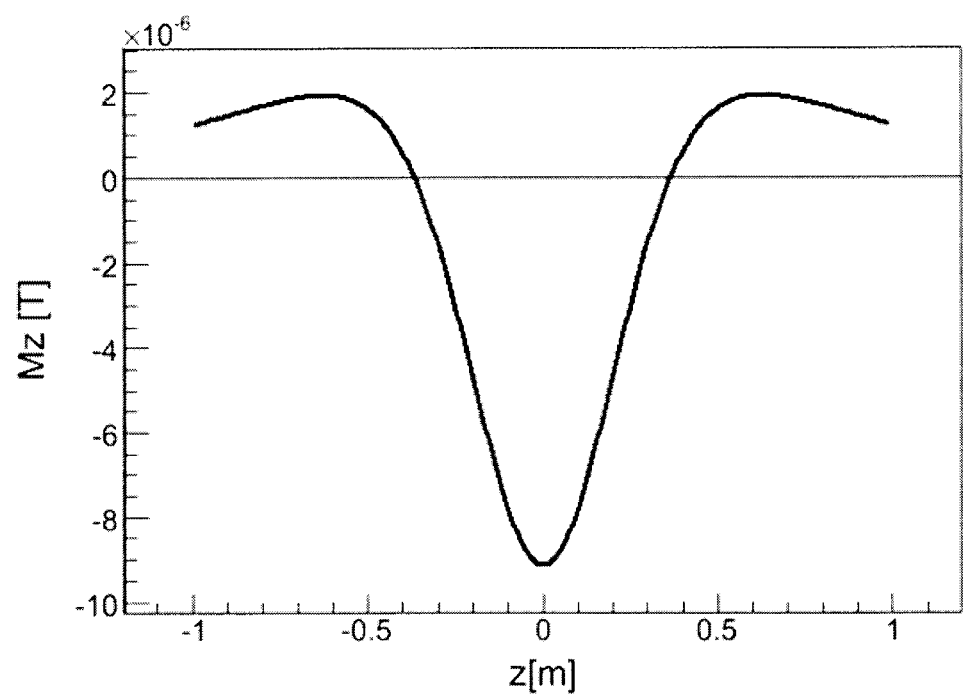
FIG. 10 shows the z component of the magnetic field produced at the null line of the MRI machine by the primary electromagnet of the auxiliary magnetic field generator when carrying 1 amp of current.

Putting the currents I into the coils of the active shield would produce the field −B at the null line (see FIG. 10). However, there are two problems that must be addressed. The first is a practical problem: it is difficult to send different amounts of current through each loop. This can be handled by transforming arbitrary currents in equally spaced wires to equal currents at arbitrarily spaced wires. Instead of defining the current in each loop, the spacing between loops is varied.

The second problem is that I is not always well behaved but may switch sign rapidly and have unnecessarily high values. The currents can be forced into 'good' behaved by adding a minimum current constraint to the K matrix. This constrain is added by doubling the number of rows in the K matrix. The additional rows are the identity matrix multiplied by a constant $\epsilon$:

$$K' = \begin{bmatrix} \varepsilon & & & \\ & \varepsilon & & \\ & & \varepsilon & \\ & & & \\ & K & & \end{bmatrix}_{m \times 2n} \quad \text{Equation 18}$$

Using K' in the solution for the loop currents I:

$$\begin{bmatrix} I \end{bmatrix}_n = \begin{bmatrix} Psudoinverse \text{ of } K' \end{bmatrix}_{n \times m} \cdot \begin{bmatrix} -B \end{bmatrix}_m \quad \text{Equation 19}$$

Solving this system produces currents I that minimize the functional F given by:

$$F = \sum_{i=1}^{m}(B_i - B_i')^2 + \varepsilon \sum_{i=1}^{n} I_n^2 \quad \text{Equation 20}$$

where $B_i$ is the z component of the magnetic field produced by unit current in the primary magnet at the $i^{th}$ sample point along the null line and $B_i'$ is the magnetic field produced at the $i^{th}$ sample point by the active shield.

Figure 11:
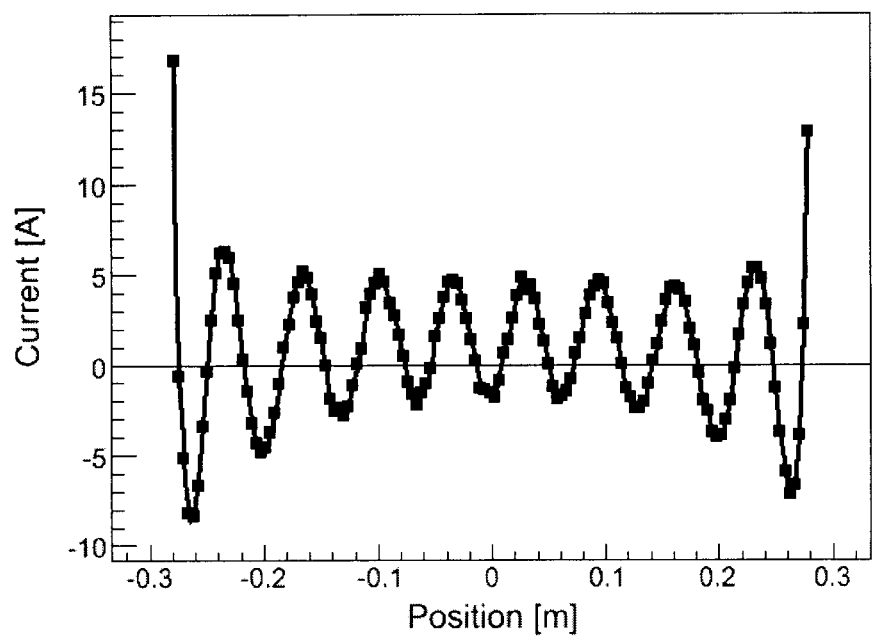
FIG. 11 shows unwanted oscillatory currents for an auxiliary magnetic field generator having a shield that does not minimize power.
Figure 12:
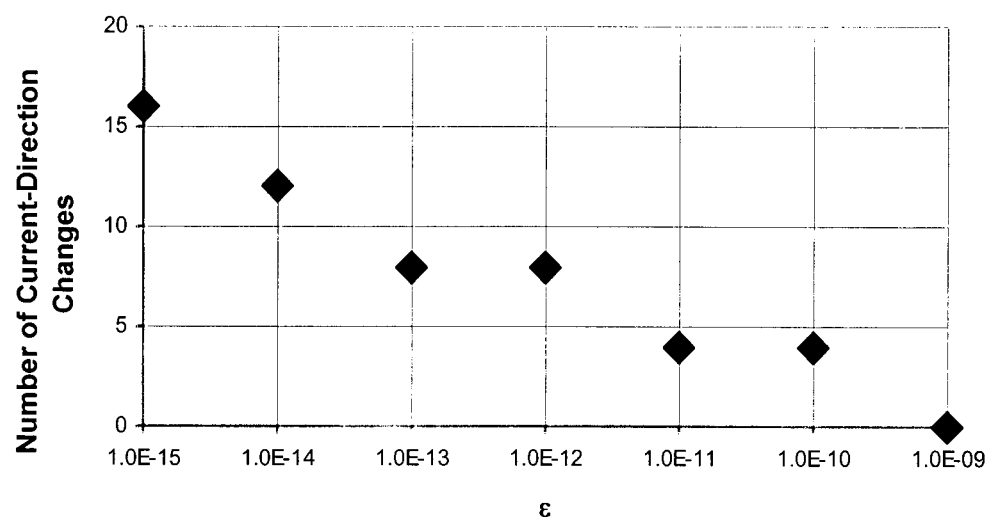
FIG. 12 shows the number of direction changes in the active shield of the auxiliary magnetic field generator as a function of $\epsilon$.

Ideally the currents I would be chosen such that $B_i = B_i'$ but this may not be possible if the system is over-determined. As mentioned earlier, when $\epsilon$ is chosen to be zero F becomes extremely small. Often one will see that the currents I will become ill behaved, each loop in the shield fluctuating between extremely high positive and negative values (see FIG. 11). Of course negative values indicate current flowing in the opposite direction. Mechanically this is achieved by simply changing the direction of the active shield conductor. Such solution is quite impractical since it results is unacceptable and unnecessary power loss is the shield. Allowing $\epsilon$ to take on a nonzero value easily rectifies the problem. Typical values of $\epsilon$ might be in the order of $10^{-10}$, approximately the residual field at the null line. The optimum value of $\epsilon$ can be found by increasing c until the maximum current in the active shield is small, <1 A and the current direction is constant in all the shield loops. If $\Delta x$ were chosen to be the thickness of the shield wire, then a current corresponding to more than 1 A would indicate that multiple wire would be occupying the same location. FIG. 12 shows the number of times that the current changes direction in the active shield as a function of $\epsilon$. As $\epsilon$ is increase the number of current changes drops from 16 for $\epsilon=0$ to 1 for $\epsilon=10^{-9}$.

Figure 13:
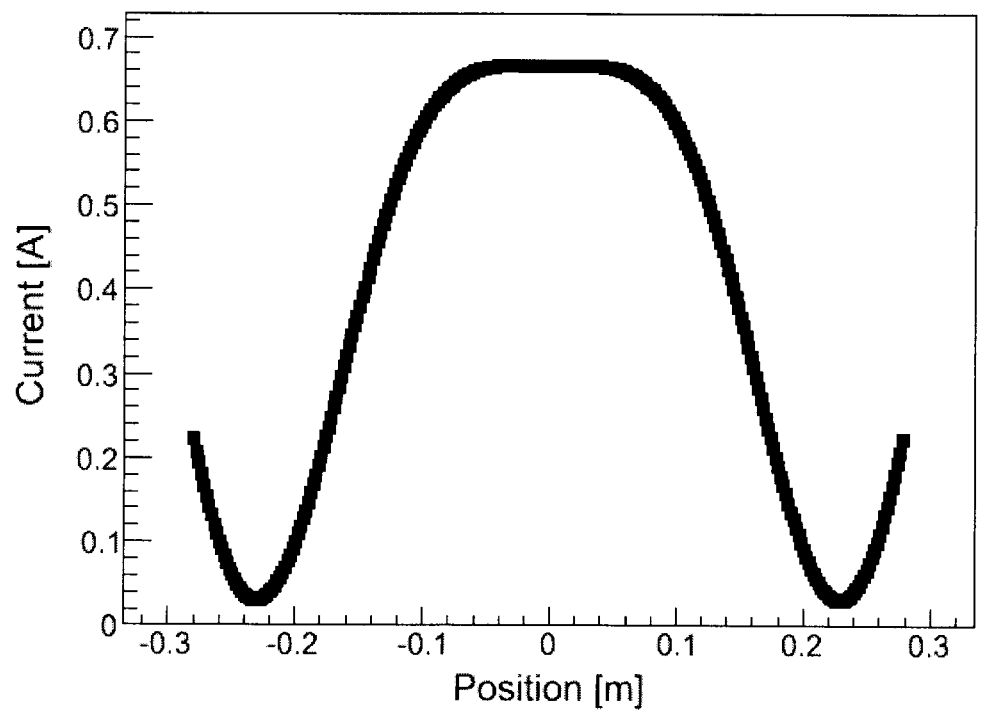
FIG. 13 illustrates that a current density with constant sign indicates that the shield windings are in the same direction.

The current at each point in the active shield found for $\epsilon=10^{-9}$ is represented by FIG. 13.

Figure 14:
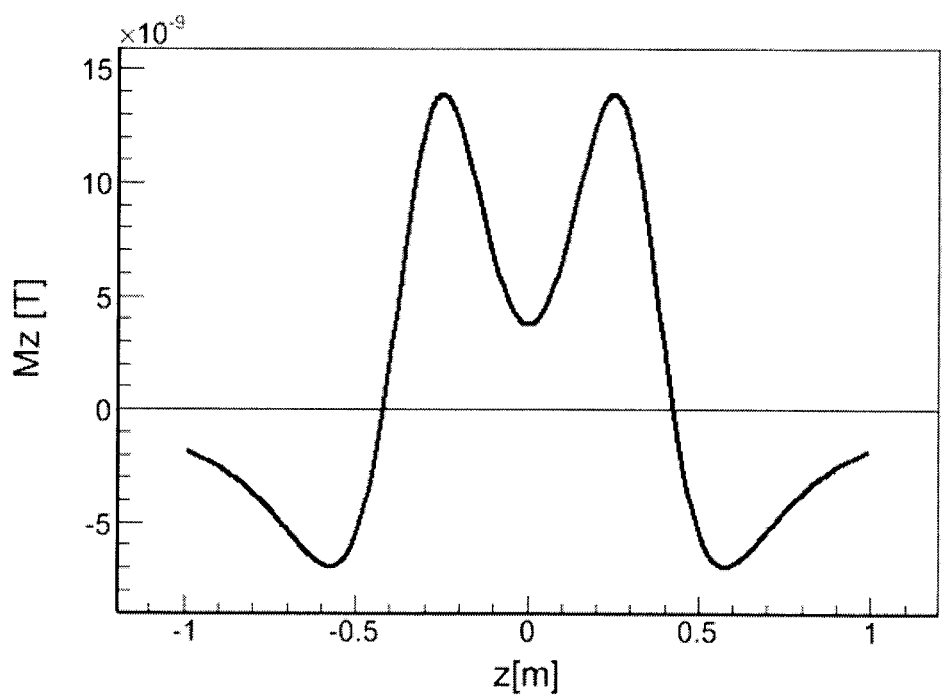
FIG. 14 shows that the magnetic field at the null line of the MRI machine is reduced by more than 3 orders of magnitude by the addition of the active shield (compare to FIG. 11)

If the number of loops n is a large number, then the current vector I can be thought of as a current density as a function of wire position (see FIG. 14). Linear interpolation can be used to smooth the current density. The original current vector was found with loops of spacing $\Delta z$, however it may be useful to interpolate the current to spacings of $\Delta z/10$. Since the number of points has increased by a factor 10, the current at each point must be decreased by a factor of 10 to maintain constant total current density. Summing the current vector and dividing by the unit current gives the number of windings needed in the shield, n'. The current density should necessarily be symmetric since the primary coil design will usually be symmetric. Final wire locations for the active shield can be located by integration of the current density outward from the center. Each time the integration reaches the value of 0.5+j, a wire is placed. In this way n' wires are placed for the shield. For further discussion, refer to Mansfield and Chapman J. Phys. E: Sci. Instrum. 19 (1986), the contents of which are incorporated by reference.

Figure 15A:
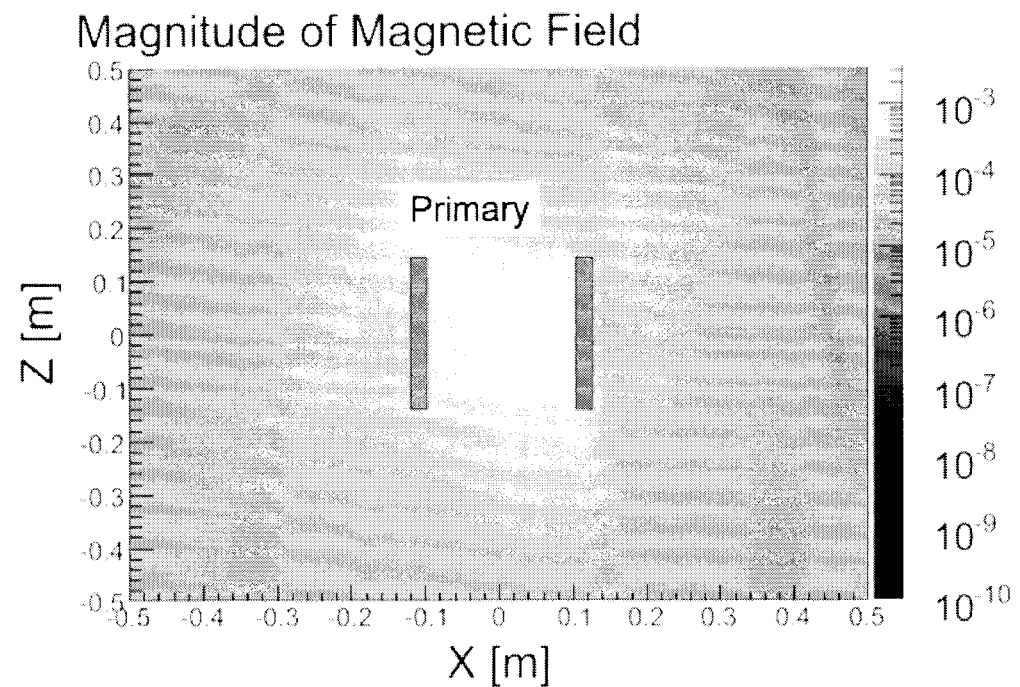
FIGS. 15a and 15b show the magnitude of the magnetic field before (15a) and after (15b) shielding in the x, z plane.
Figure 15B:
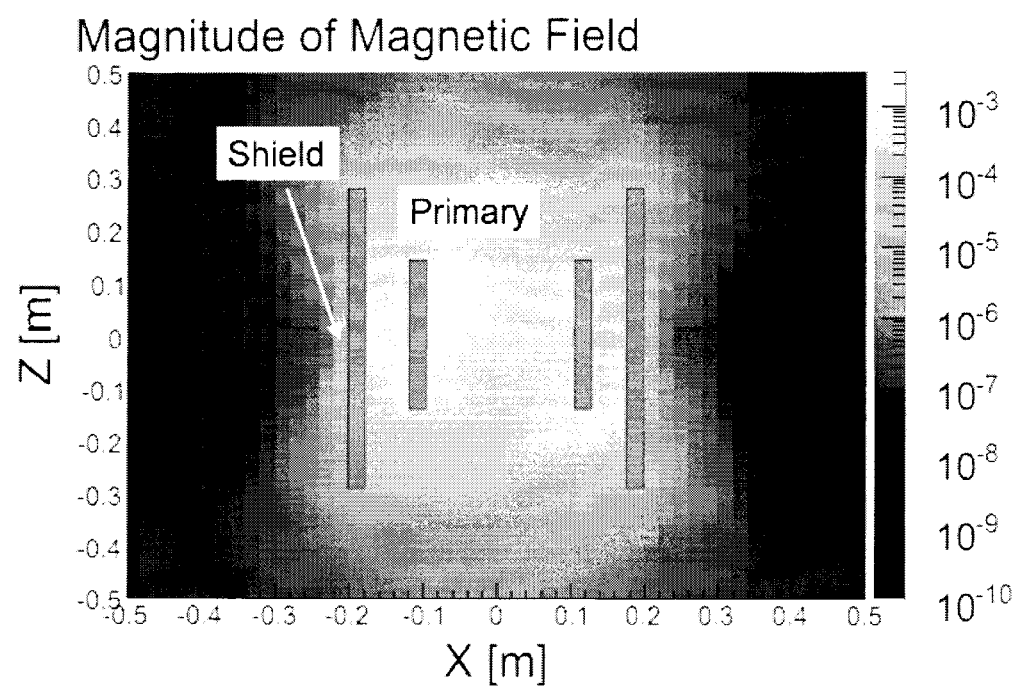
Figure 16A:
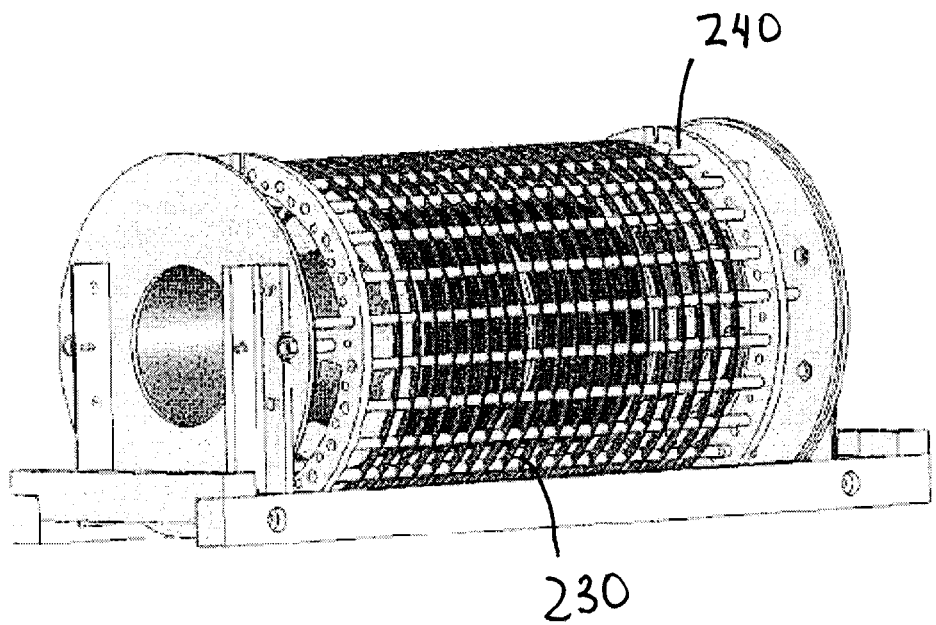
FIG. 16a is a perspective view of internal components of the auxiliary magnetic field generator.
Figure 16B:
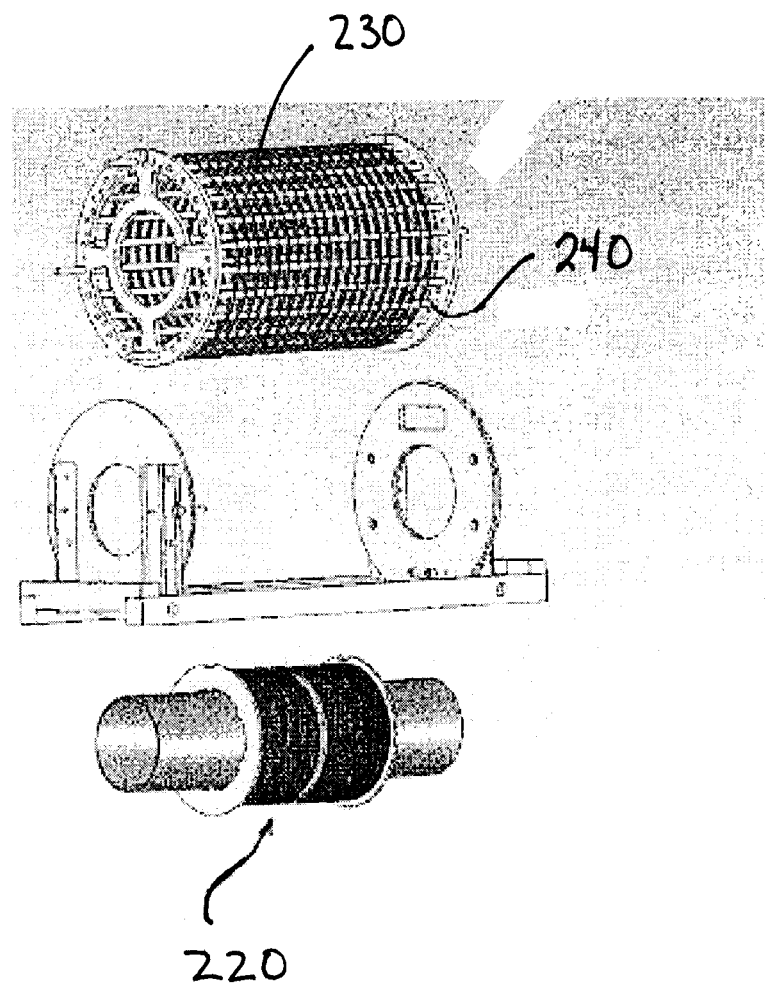
FIG. 16b is an exploded perspective view of the internal components of the auxiliary magnetic field generator.
Figure 16C:
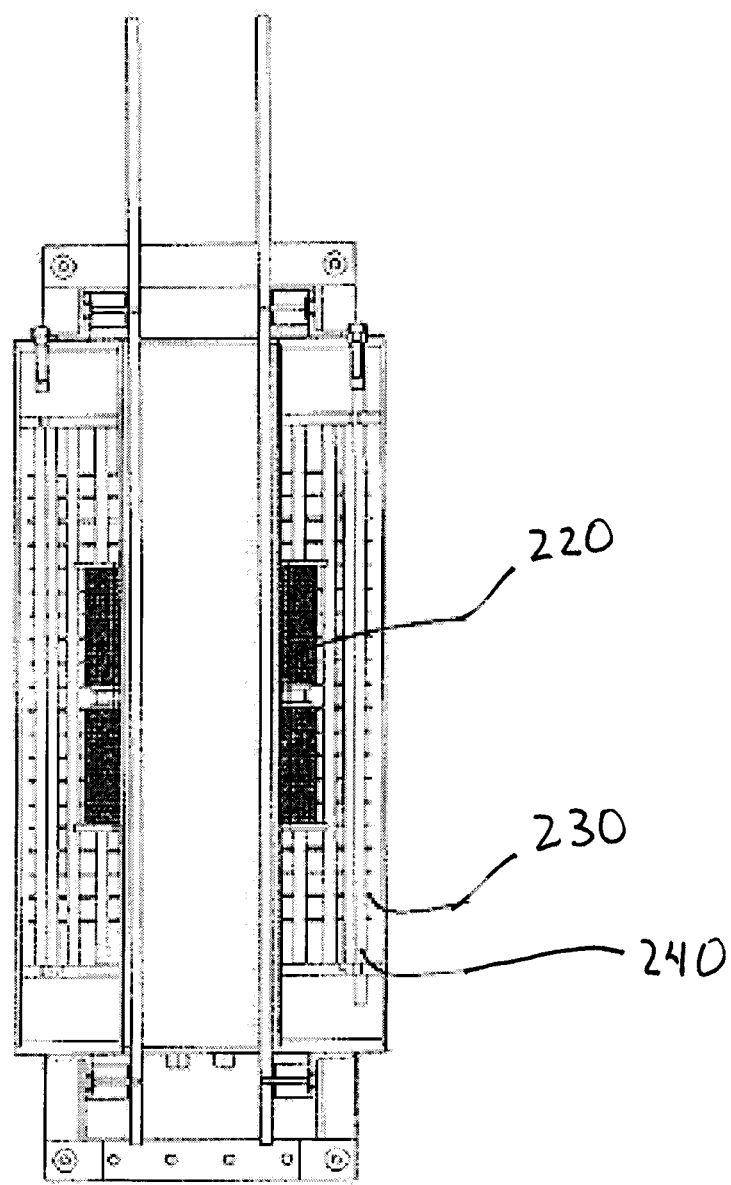
FIG. 16c is a cross-sectional view of the internal component of the auxiliary magnetic field generator.
Figure 16D:
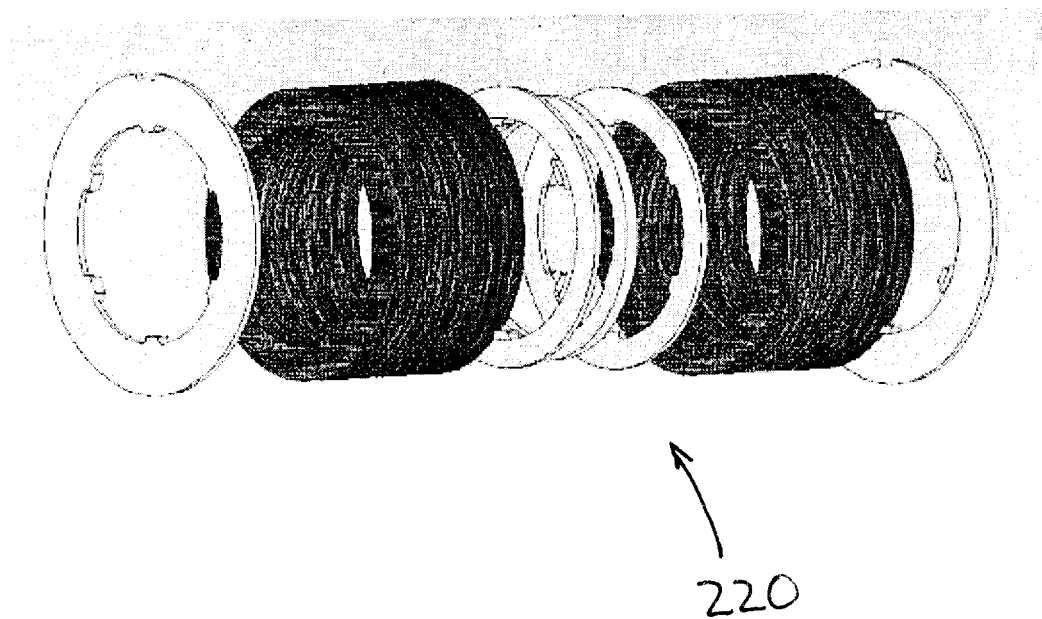
FIG. 16d is a perspective exploded view of a primary electromagnet forming part of the auxiliary magnetic field generator.
Figure 17:
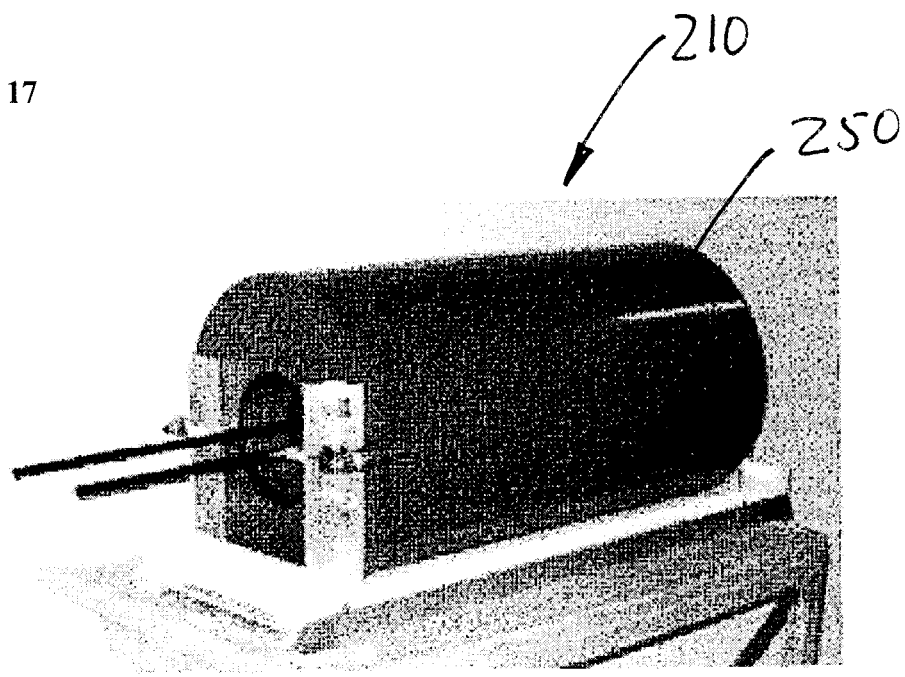
FIG. 17 is a perspective view of the auxiliary magnetic field generator.

FIG. 15a shows the magnitude of the magnetic field before shielding in the x, z plane. FIG. 15b illustrates the benefit of the active shield. At a distance of 50 cm the magnitude of the magnetic field has been decreased by over 3 orders of magnitude. By comparison, the strength of the polarizing magnetic field inside the system has only dropped by 25%.

FIGS. 16a to 16d and 17 show a specific implementation of the auxillary magnetic field generator 210. In this example, the primary electromagnet 220 is an epoxy-reinforced solenoid wound with #4 AWG, square cross-section, magnet wire. The inside diameter (ID), outside diameter (OD) and length of the primary electromagnet 220 are 19, 25 and 27 cm respectively. The active shield 230 is in the form of a counter-wound coil wound around a 36 cm diameter Ultem birdcage-like form 240 that is concentric with and surrounds the primary electromagnet 22. The counter-wound coil employs 108 turns of #7 AWG-equivalent Litz wire. Thin-walled Teflon® tubing is wound in close proximity to the inner and outer surfaces of the primary electromagnet and active shield assembly. The tubing is coupled to a coolant source (not shown) that supplies coolant (air, water or other suitable medium) to the tubing to stabilize the temperature of the auxillary magnetic field generator 210. The primary electromagnet 220, active shield 230, form 240 and coolant tubing are potted in thermally conductive epoxy resin 250 resulting in a total auxillary magnetic field generator weight of about 150 kg.

Figure 18:
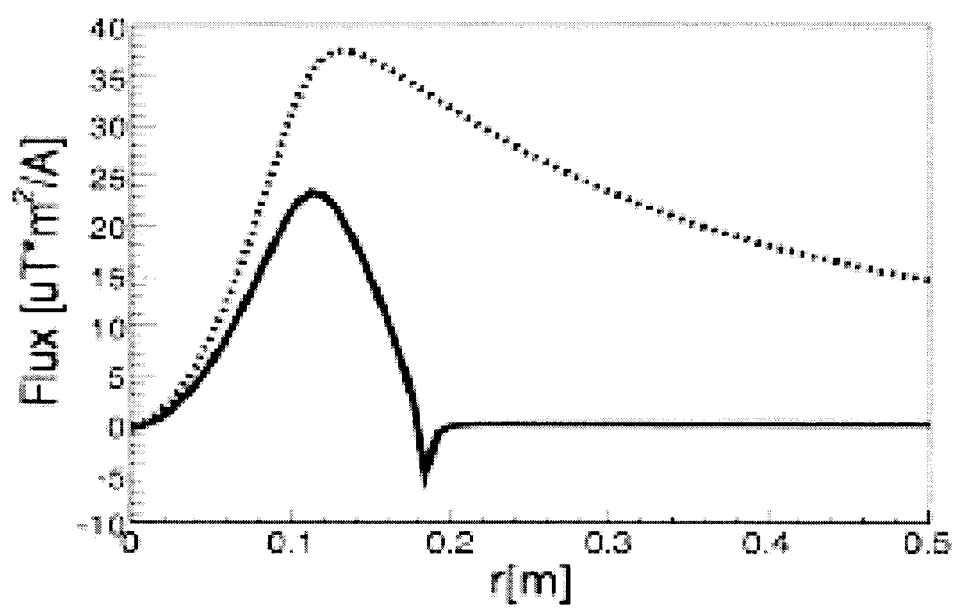
FIG. 18 shows magnetic flux produced by the auxiliary magnetic field generator within a circle of radius r for both an auxiliary magnetic field generator with a shield (solid lines) and without a shield (dashed lines)

FIG. 18 illustrates the calculated net magnetic flux in the XY plane produced by the auxiliary magnetic field generator as a function of radial distance (r) from the center of the coil of the primary electromagnet 220. Flux calculations for an activity shielded and unshielded primary magnet are plotted. The addition of the active shield reduces the net flux at 50 cm by a factor of 1400. FIG. 15b shows the calculated magnetic field profile efficiencies of the auxillary magnetic field generator in the XZ plane as well as the relative positions and sizes of the primary magnet and active shield.

Figure 19:
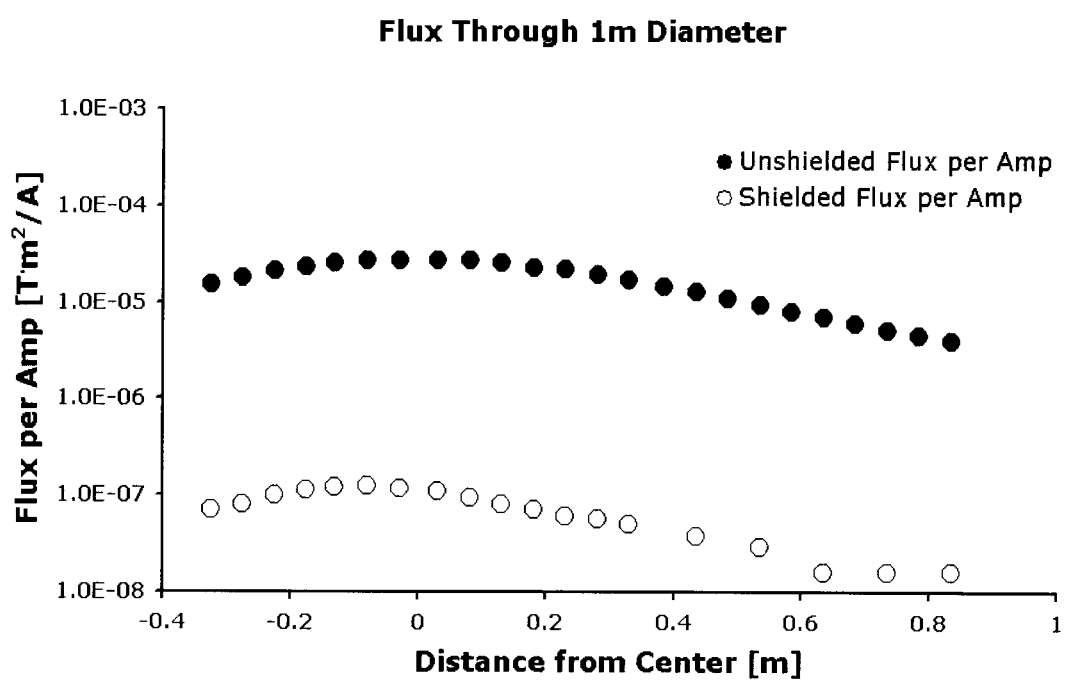
FIG. 19 shows that the shield lowers the net flux by ~220 times.

Inductance and resistance were measured to be 7.0 mH and 400 mΩ at 20° C. Total flux through a 50 cm radius in the transverse plane was measured at various points along the length of the auxillary magnetic field generator as shown in FIG. 19. Measurements show that the addition of the active shield reduced the total flux by approximately 220 times. MR compatible thermocouples were used to evaluate the maximum sustained primary magnet coil current. With 6 L/min flow of 20° C. coolant water through the tubing, a sustained current of 100 A raised the internal temperature to 90° C., a conservative temperature limit for some of the insert materials.

The actively shielded auxillary magnetic field generator enables field-cycled MRI contrast in clinical MR scanners. Laboratory measurements showed that the total flux produced by the actively shielded $B_0$ insert is less than other MR compatible insert coils (as described in Chronik B A, Alejski, A, Rutt B K. Magn. Reson. in Med, vol 44, p 955-963; incorporated by reference), and therefore the actively shielded auxillary magnetic field generator is not expected to damage a host MRI system.

The ability to produce a magnetic field waveform enables the application of any process that produces MRI signal which is a function of field strength.

While the active shielding of the auxiliary magnetic field generator is useful in some applications, it is not necessary in all cases. In some embodiments, the auxillary magnetic field generator may be partially shielded. In some further embodiments, the auxillary magnetic field generator may comprise an unshielded electromagnet. The requirement for shielding will ultimately depend on the particular embodiment and the degree to which the net flux of the auxillary magnetic field generator negatively effects with the host MRI system.

In some embodiments the auxillary magnetic field generator may include ferromagnetic, paramagnetic or diamagnetic elements in order to allow further control over the magnetic field produced. In some embodiments, the auxillary magnetic field generator may not require cooling.

Figure 20:
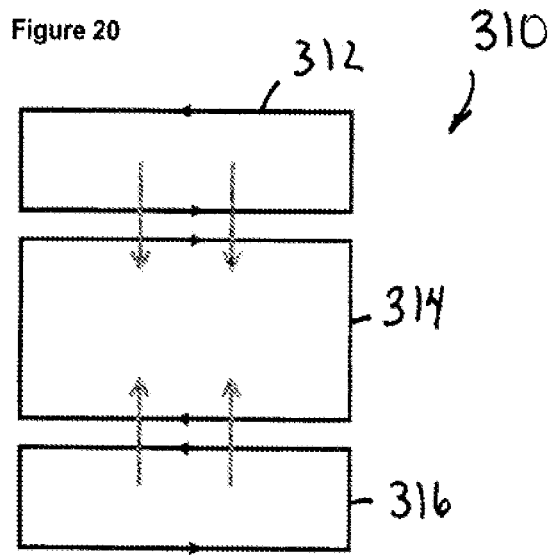
FIGS. 20 and 21 are plan views of an alternative auxiliary magnetic field generator.
Figure 21:
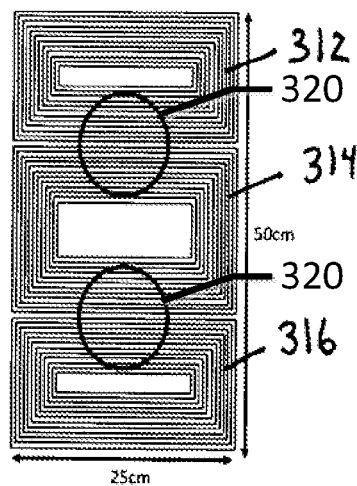

Although FIGS. 9a, 9b and 16a to 17 show the auxiliary magnetic field generator as being generally cylindrical and axially accommodated by the bore in the cryostat of the MRI machine, other auxiliary magnetic field configurations are possible. For example, FIGS. 20 and 21 show a generally planar auxillary magnetic field generator 310. The auxiliary magnetic field generator 310 comprises three distinct windings 312 to 316. The outer windings 312 and 316 are configured to provide counter-clockwise current paths while the intermediate winding 314 is configured to provide a clockwise current path. The dimensions of the outer winding current paths are selected so that the combined area contained by the two outer windings 312 and 316 is generally equal to the area contained by the intermediate winding 314. The current paths of the outer windings torque balance the auxiliary magnetic field generator and increase the magnetic field generated by the auxiliary magnetic field generator.

Figure 22:
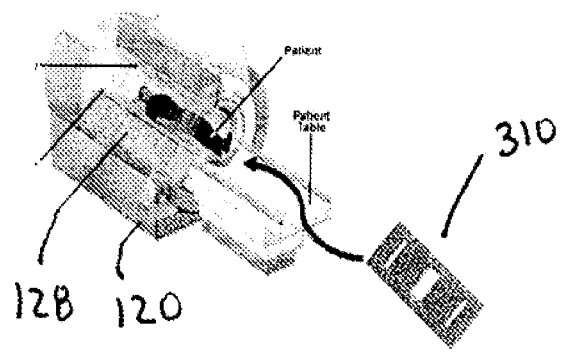
FIG. 22 shows positioning of the alternative auxillary magnetic field generator of FIGS. 20 and 21 in an MRI machine.

In use, the auxiliary magnetic field generator 310 is placed on the table either beneath or beside the patient as shown in FIG. 22. When the auxiliary magnetic field generator 310 is energized magnetic fields as identified by reference character 320 are generated.

The particular wire pattern shown is FIGS. 20 and 21 is not the only possible design for the auxiliary magnetic filed generator. Other coils having a different number and/or position of current paths may be employed; however the requirements are always the same. The auxiliary magnetic field generator should be force and torque balanced, be able to be positioned off-axis without inductive coupling to the MRI machine, and produce a magnetic field with as much homogeneity as possible that is strong enough to shift the polarizing magnetic field. The auxiliary magnetic field generator may also be curved to increase field strength and match the geometry of the subject. For instance auxiliary magnetic field generator for human head imaging may be highly curved while an inset for the chest may be only slightly curved. Cooling structure may optionally be provided on the auxiliary magnetic field generator to remove excess heat.

In some embodiments, if desired the auxiliary magnetic field generator may be permanently installed within the MRI machine to permit active control over the static polarizing magnetic field. This capability enables the application of any process that produces MRI signal which is a function of field strength. Furthermore, this capability would allow users to take advantage of any process related to MRI or involved in MRI that varies with polarizing magnetic field strength.

This technology could be used with super paramagnetic iron oxide contrast agents (SPIO agents) in order to improve image contrast or quantification of contrast agent concentration. SPIO particles produce contrast depending to some extent on the magnetic field magnitude. These agents tend to saturate at magnetic fields as high as those used in traditional MRI systems. With the present technology, the magnetic field may be reduced within an MRI system such that the SPIO-based contrast could be modulated and quantified. Any applications using any susceptibility-based contrast agent would be impacted by this invention.

Any MRI application which takes advantage of diffusion-based contrast could be impacted through this technology. Diffusion contrast in MRI relies on the motion of magnetization through an environment in which there exist magnetic field gradients typically produced through surrounding magnetic susceptibility differences in the material. These differences are dependent on the polarizing magnetic field strength and therefore could be modulated through use of this technology. The diffusion contrast could therefore be enhanced or reduced or quantified depending on the specific magnetic field exposure chosen.

The above-described embodiments are intended to be examples and alterations and modifications may be effected thereto, by those of skill in the art, without departing from the scope of the invention which is defined by the appended claims.

REFERENCES

1. Gilbert K M, Handler W B, Scholl T J, Odegaard J W, Chronik B A. Design of field-cycled magnetic resonance systems for small animal imaging. Phys Med Biol 2006; 51 (11):2825-2841.
2. Gianolio et al. CHEM Med Chem. 2008, vol 3, 60-62.

3. Caravan et al. Inorganic Chemistry 2007 Aug. 6; 46 (16): 6632-9.
4. Alford, et al. ISMRM Poster #867, 2005.
5. Henriksen O, de Certaines J D, Spisni A, Cortsen M, Muller R N, Ring P B. In vivo field dependence of proton relaxation times in human brain, liver and skeletal muscle: a multicenter study. Magn Reson Imaging 1993; 11 (6):851-856.

The above-references are incorporated herein by reference.

What is claimed is:

1. A magnetic resonance imaging (MRI) method comprising:
    imaging a subject that has been administered with a contrast agent or endogenous substance using an MRI machine, said contrast agent or endogenous substance binding to target molecules in said subject and demonstrating a magnetic field-dependent variation in one or more MRI properties, wherein during said imaging:
        the strength of the static polarizing magnetic field of said MRI machine is shifted in different directions so that said subject is exposed to a variable magnetic field that highlights the magnetic field-dependent variation in the one of more MRI properties of said contrast agent or endogenous substance,
        an image in the presence of said static polarizing magnetic field following a shift in the strength thereof in one direction is acquired and then,
        an image in the presence of said static polarizing magnetic field following a shift in the strength thereof in the opposite direction is acquired; and
    subtracting the acquired images to yield an enhanced contrast image.

2. The method of claim 1 wherein
    during said imaging the strength of the static polarizing magnetic field of said MRI machine is shifted during relaxation portions of pulse sequences.

3. The method of claim 2 wherein the timing, magnitude and duration of each static polarizing magnetic field shift is chosen to maximize image contrast.

4. The method of claim 2 wherein the static polarizing magnetic field is shifted in each direction by substantially the same amount.

5. The method of claim 2 wherein during said imaging an electromagnet is conditioned to generate magnetic field pulses of opposite polarities to shift the static polarizing magnetic field in opposite directions.

6. The method of claim 5 wherein during said imaging said electromagnet is removably inserted into said MRI machine.

7. The method of claim 6 wherein during said imaging said electromagnet is positioned axially within a bore of said MRI machine.

8. The method of claim 6 wherein during said imaging said electromagnet is positioned either beneath or beside a patient positioned within a bore of said MRI machine.

9. A magnetic resonance imaging (MRI) method comprising:
    scanning a subject that has been administered with either a contrast agent or an endogenous substrate using an MRI machine and generating an image for each scan, wherein said contrast agent or endogenous substance binds to target molecules in said subject and demonstrates a magnetic field-dependent variation in one or more MRI properties and wherein said scanning comprises shifting the strength of the static polarizing magnetic field of said MRI machine in different directions so that said subject is exposed to a variable magnetic field that highlights the magnetic field-dependent variation in the one or more MRI properties of said contrast agent or endogenous substance, and acquiring an image in the presence of said static polarizing magnetic field following a shift in the strength thereof in one direction and an image in the presence of said static polarizing magnetic field following a shift in the strength thereof in the opposite direction; and
    subtracting the images to yield an enhanced contrast image.

10. The method of claim 9 wherein
    during said shifting the static polarizing magnetic field of said MRI machine is firstly shifted in one direction during a relaxation portion of a first pulse sequence and
    is then shifted in an opposite direction during a relaxation portion of a second pulse sequence.

11. The method of claim 10 wherein the first shifting comprises subjecting the polarizing magnetic field of the MRI machine to a magnetic field pulse of a first polarity during the relaxation portion of the first pulse sequence and wherein the second shifting comprises subjecting the polarizing magnetic field of the MRI machine to a magnetic field pulse of a second polarity during the relaxation portion of the second pulse sequence.

12. The method of claim 11 wherein the timing, magnitude and duration of each polarizing magnetic field shift is chosen to maximize image contrast.

13. The method of claim 11 wherein the static polarizing magnetic field is shifted in each direction by substantially the same amount.

14. The method of claim 11 wherein said subjecting comprises conditioning an electromagnetic to generate the magnetic field pulses of said first and second polarities.

15. The method of claim 14 wherein said subjecting comprises removeably inserting said electromagnetic into said MRI machine.

16. A method for magnetic resonance (MRI) imaging comprising:
    imaging a subject that has been administered with either a contrast agent or an endogenous substance using an MRI machine, said contrast agent or endogenous substance binding to target molecules in said subject and demonstrating a magnetic field-dependent variation in one or more MRI properties, wherein during said imaging the subject is scanned utilizing static polarizing magnetic fields of different strengths following strength shifts thereof in opposite directions and an image following each static polarizing magnetic field shift is acquired; and
    processing the images to generate selective image contrast of said subject based on the variation of at least one MR property of the subject in response to the different static polarizing magnetic field strengths.

17. The method of claim 16 wherein
    during said imaging the strength of the static polarizing magnetic field of the MRI machine is shifted in different directions during relaxation portions of pulse sequences.

18. The method of claim 17 wherein the timing, magnitude and duration of each polarizing magnetic field shift is chosen to maximize image contrast.

19. The method of claim 17 wherein the static polarizing magnetic field is shifted in each direction by substantially the same amount.

20. The method of claim 17 wherein the static polarizing magnetic is shifted by conditioning an electromagnet to generate magnetic field pulses of opposite polarities to shift the static polarizing magnetic field in opposite directions.

21. The method of claim 20 wherein the static polarizing magnetic field is shifted by removeably inserting said electromagnet into said MRI machine.

22. An MRI machine comprising:
- a housing having a bore in which a subject to be imaged is placed;
- a polarizing electromagnet accommodated by said housing and generating a generally uniform static polarizing magnetic field within said bore;
- pulse generating coils to generate pulses in sequences to scan the subject;
- gradient coils to encode acquired MRI signals;
- an auxiliary magnetic field generator controllable to shift the strength of the static polarizing magnetic field in opposite directions during relaxation portions of the sequences; and processing structure configures to subtract images acquired following each static polarizing magnetic field shift to yield a contrast image.

23. The MRI machine according to claim 22 further comprising a shield to reduce external magnetic flux emitted by said auxiliary magnetic field generator.

24. The MRI machine according to claim 23 wherein said electromagnet device comprises a primary magnet and wherein said shield comprises a coil coaxial with and surrounding said primary magnet.

25. The MRI machine according to claim 22 further comprising cooling structure configured to cool said electromagnet device.

26. The MRI machine according to claim 22 wherein said electromagnet comprises a series of distinct coils.

27. The MRI machine according to claim 26 wherein said coils are configured to balance torque.

28. The MRI machine according to claim 26 further comprising cooling structure configured to cool said coils.

29. A magnetic resonance imaging method comprising:
- performing imaging where more than one polarizing magnetic field strength is used during scanning, comprising:
  - shifting the strength of the polarizing magnetic field of an MRI machine in a first direction during a relaxation portion of a pulse sequence;
  - acquiring a first image while the polarizing magnetic field is shifted in the first direction;
  - shifting the strength of the polarizing magnetic field of an MRI machine in a second direction, opposite the first direction, during a relaxation portion of a pulse sequence; and
  - acquiring a second image while the polarizing magnetic field is shifted in the second direction; and
- processing at least the first and second image to yield an enhanced contrast image.

* * * * *